United States Patent
Bash et al.

(10) Patent No.: US 7,272,945 B2
(45) Date of Patent: Sep. 25, 2007

(54) ENVIRONMENTAL CONDITION MEASUREMENT SYSTEM

(75) Inventors: Cullen Edwin Bash, San Francisco, CA (US); George Henry Forman, Port Orchard, WA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 423 days.

(21) Appl. No.: 10/628,369

(22) Filed: Jul. 29, 2003

(65) Prior Publication Data

US 2005/0024826 A1    Feb. 3, 2005

(51) Int. Cl.
F25D 17/00 (2006.01)
F25B 1/00 (2006.01)
F24F 11/04 (2006.01)
H05K 7/20 (2006.01)

(52) U.S. Cl. ............................. 62/180; 62/229; 62/178; 165/247; 361/695

(58) Field of Classification Search ................. 62/180, 62/229, 178, 177; 165/243, 247, 104.33; 361/695

See application file for complete search history.

(56) References Cited

U.S. PATENT DOCUMENTS 6,658,325 B2 * 12/2003 Zweig ........................ 700/245

FOREIGN PATENT DOCUMENTS

| JP | 02078848 A | * | 3/1990 |
| JP | 06002892 A | * | 1/1994 |
| JP | 11322125 A | * | 11/1999 |

* cited by examiner

Primary Examiner—Chen Wen Jiang

(57) ABSTRACT

A system for detecting at least one environmental condition in a room. The system includes one or more detecting devices having a sensor configured to detect the at least one environmental condition and to display the detected at least one environmental condition. The system also includes one or more reader devices configured to image the one or more detecting devices and a controller configured to communicate with the one or more reader devices. The controller is operable to control the one or more reader devices and to receive the images from the one or more reader devices. In addition, the controller is configured to determine the at least one environmental condition based upon the images of the one or more detecting devices. The system further includes a memory accessible by the controller, and the controller is configured to store the at least one environmental condition in the memory.

36 Claims, 10 Drawing Sheets

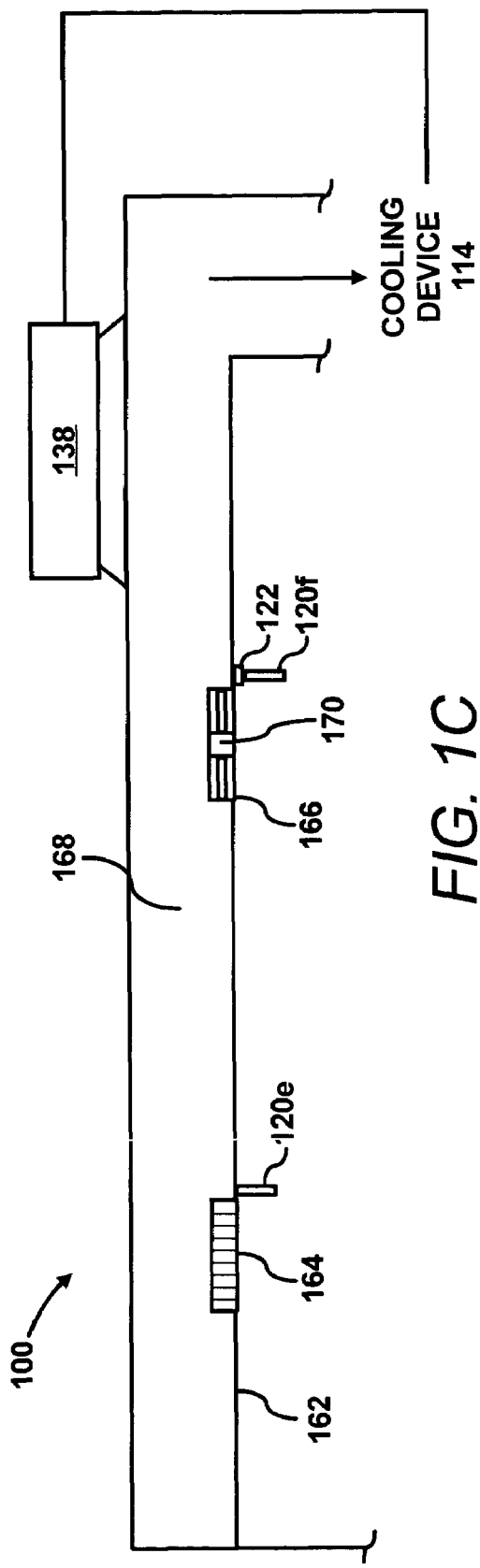
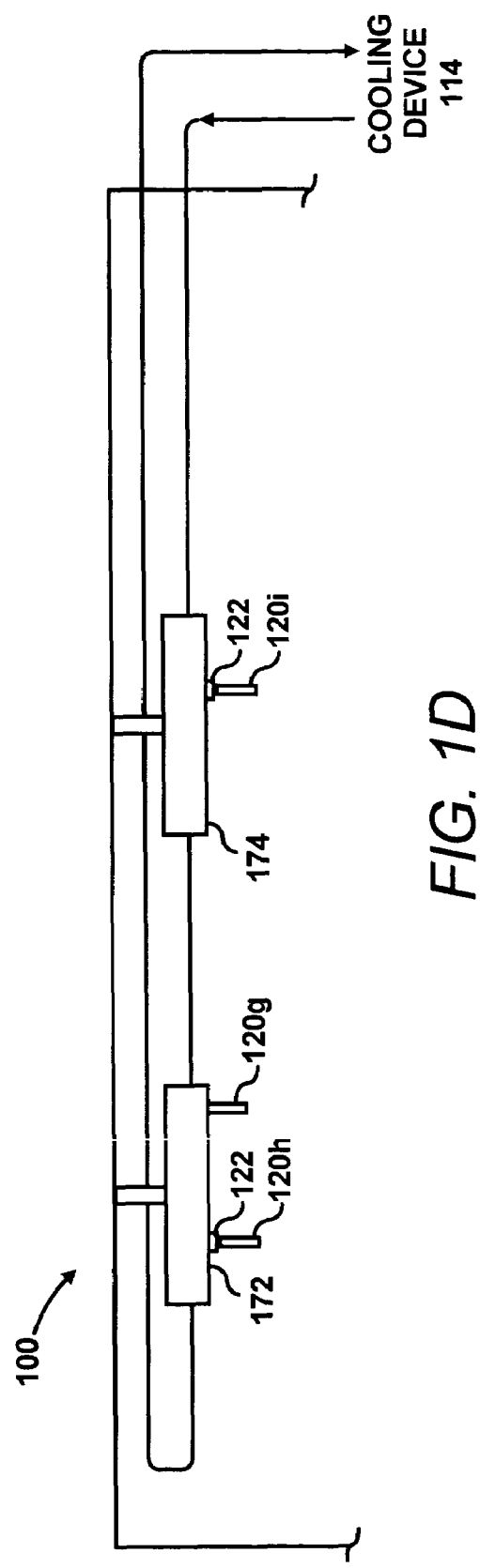

ENVIRONMENTAL CONDITION MEASUREMENT SYSTEM

BACKGROUND OF THE INVENTION

A data center may be defined as a location, e.g., room, that houses computer systems arranged in a number of racks. A standard rack, e.g., electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, e.g., about forty (40) systems, with future configurations of racks being designed to accommodate up to eighty (80) systems. The computer systems typically include a number of components, e.g., one or more of printed circuit boards (PCBs), mass storage devices, power supplies, processors, micro-controllers, semi-conductor devices, and the like, that may dissipate relatively significant amounts of heat during the operation of the respective components. For example, a typical computer system comprising multiple microprocessors may dissipate approximately 250 W of power. Thus, a rack containing forty (40) computer systems of this type may dissipate approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid. e.g., air, cooling fluid, etc., across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically require a minimum of about thirty (30) percent of the required operating energy to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially continuous operation of the air conditioning units is generally designed to operate according to a worst-case scenario. For example, air conditioning systems are typically designed around the maximum capacity and redundancies are utilized so that the data center may remain on-line on a substantially continual basis. However, the computer systems in the data center may only utilize around 30-50% of the maximum cooling capacity. In this respect, conventional cooling systems often attempt to cool components that may not be operating at a level which may cause their temperatures to exceed a predetermined temperature range. Consequently, conventional cooling systems often incur greater amounts of operating expenses than may be necessary to sufficiently cool the heat generating components contained in the racks of data centers.

Another problem associated with the cooling of data centers involves the expense and difficulty in measuring the environmental conditions, e.g., temperature, humidity, air flow, etc., within and around the racks. Although it has been found that the use of temperature sensors, e.g., thermocouples, located at various locations throughout the data center has been a relatively accurate manner of detecting temperatures, this practice has also been found to be relatively restrictive due to the difficulty and costs associated with this implementation. By way of example, the number of sensors required to detect the environmental conditions throughout the data center may require that a substantially large number of sensors be implemented.

In addition, when the racks or components of a data center are added or re-arranged, the locations of the sensors must also be moved or recalibrated. Since most conventional sensors are wired to a power source and to a network for transmitting information, the movement of the sensors may prove to be a relatively difficult task requiring a great deal of time and manual input.

SUMMARY OF THE INVENTION

According to an embodiment, the present invention pertains to a system for detecting at least one environmental condition in a room. The system includes one or more detecting devices having a sensor configured to detect the at least one environmental condition and to display the detected at least one environmental condition. The system also includes one or more reader devices configured to image the one or more detecting devices and a controller configured to communicate with the one or more reader devices. The controller is operable to control the one or more reader devices and to receive the images from the one or more reader devices. In addition, the controller is configured to determine the at least one environmental condition based upon the images of the one or more detecting devices. The system further includes a memory accessible by the controller, and the controller is configured to store the at least one environmental condition in the memory.

According to another embodiment, the invention relates to a method for measuring at least one environmental condition in a room. In the method, one or more detecting devices having a sensor configured to detect the at least one environmental condition and to display the detected at least one environmental condition are prepared and positioned in the room. One or more reader devices are implemented to image the one or more detecting devices. In addition, the at least one environmental condition detected by the one or more detecting devices is determined based upon the images of the one or more detecting devices.

According to a further embodiment, the present invention relates to a method for controlling at least one environmental condition in a room. In the method, one or more detecting devices having a sensor configured to detect the at least one environmental condition and to display the detected at least one environmental condition are prepared and positioned in the room. One or more reader devices are implemented to image the one or more detecting devices and the at least one environmental condition detected by the one or more detecting devices is determined based upon the images of the one or more detecting devices. In addition, one or more cooling system components are manipulated in response to the at least one environmental condition falling outside of predetermined ranges.

According to yet another embodiment, the invention relates to a system for detecting at least one environmental condition in a room. The system includes one or more infrared image sensors configured to sense temperatures of one or more locations in the room. The system also includes a controller configured to communicate with the one or more infrared image sensors. The controller is operable to control the one or more infrared image sensors and to receive temperature information from the one or more infrared image sensors. In addition, the controller is configured to determine the at least one environmental condition based upon the received information. The system further includes a memory accessible by the controller, and the controller is configured to store the temperature information in the memory.

According to yet another embodiment, the invention relates to a system for detecting at least one environmental condition in a room. The system includes means for detecting the at least one environmental condition; means for imaging the means for detecting the at least one environmental condition; and means for determining the at least one environmental condition from the means for imaging the means for detecting.

According to yet another embodiment, the invention relates to a computer readable storage medium on which is embedded one or more computer programs. The one or more computer programs are configured to implement a method for measuring at least one environmental condition in a room. The one or more computer programs include a set of instructions for: implementing one or more reader devices to image one or more detecting devices having a sensor configured to detect the at least one environmental condition and to display the detected at least one environmental condition; and determining the at least one environmental condition detected by the one or more detecting devices based upon the images of the one or more detecting devices.

BRIEF DESCRIPTION OF THE DRAWINGS

Features of the present invention will become apparent to those skilled in the art from the following description with reference to the figures, in which:

FIG. 1C is a cross-sectional side view of an upper portion of the data center shown in FIGS. 1A and 1B according to an embodiment of the invention;

FIG. 1D is a cross-sectional side view of an upper portion of the data center shown in FIGS. 1A and 1B according to a further embodiment of the invention

DETAILED DESCRIPTION OF THE INVENTION

Figure 1A:
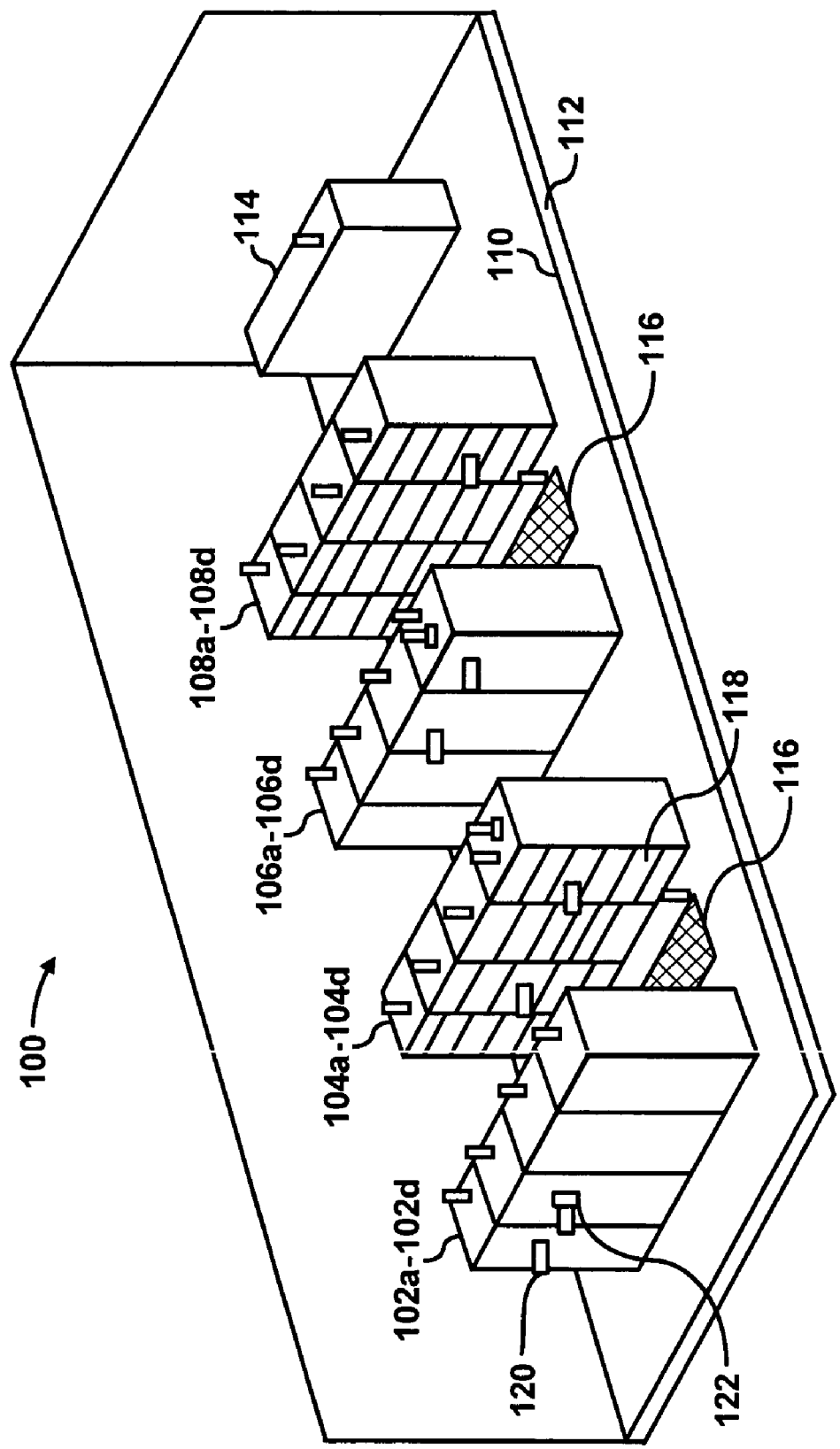
FIG. 1A shows a simplified perspective view of a room, e.g., a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated air". For purposes of simplicity, "cooling fluid" may generally be defined as air that has been cooled by a cooling device, e.g., an air conditioning unit. In addition, "heated air" may generally be defined as air, or cooling fluid, that has been heated, e.g., cooling fluid, that has received heat from a heat generating/dissipating component. It should be readily apparent, however, that the terms "cooling fluid" are not intended to denote air that only contains cooled air and that "heated air" only contains air that has been heated. Instead, embodiments of the invention may operate with air that contains a mixture of heated air and cooling fluid. In addition, cooling fluid and heated air may denote gases other than air, e.g., refrigerant and other types of gases known to those of ordinary skill in the art that may be used to cool electronic components.

According to embodiments of the invention, detecting devices configured to detect one or more environmental conditions are positioned at various locations in a data center. The detecting devices may be positioned at any location, e.g., on racks, components, cooling system components, and the like, where it may be necessary or desirable to measure environmental conditions. In addition, the detecting devices may be positioned with respect to various components in the data center to detect environmental condition(s) of the air located in their respective vicinities. For instance, the detecting devices may be attached to the various components via insulating material to substantially prevent contact between the detecting devices and the various components.

According to an embodiment of the invention, the detecting devices may comprise a relatively simple construction and may be configured to display or otherwise show the detected condition(s) such that an information gathering device, e.g., camera or other sensor, may receive the detected condition(s). The detecting devices may comprise liquid crystals configured to change colors in response to changes in environmental condition(s), e.g., temperature, pressure, humidity, etc. The detecting devices may also comprise displays, e.g., liquid crystal displays, to show the detected environmental condition(s), which may be obtained by the information gathering device. In addition, the detecting devices may comprise other relatively simple temperature detecting apparatuses, e.g., conventional mercury thermometers, bimetallic spring thermometers, and the like.

The information gathering device may comprise a camera, e.g., analog or digital, having a charge-coupled device (CCD) and may be configured to obtain still images and/or video images. In addition, the information gathering device may comprise an infrared image sensor. The information gathering device may be positioned at one or more locations, e.g., the floor, ceiling, or walls, on racks or other apparatuses, etc., in the data center to obtain the environmental condition from the from the detecting devices. In addition, the information gathering device may be positioned on a robotic device configured to travel through the data center.

According to a further embodiment of the invention, the detected environmental condition information may be implemented to control cooling fluid delivery to and/or heated air removal from various sections of the data center. For instance, the detected environmental condition information may be implemented in operating components to vary cooling fluid delivery through vents, removal of heated air, and/or the operations of an air conditioning unit.

Through the use of detecting devices according to embodiments of the invention, as the configuration of the data center changes, it may be substantially unnecessary to manually reconfigure sensors that detect environmental conditions. Instead, the locations of the detecting devices may be determined in a substantially autonomous manner. One result may be that the amount of time in rewiring sensors and determining their locations may be substantially reduced, thereby reducing the costs associated with operating a data center.

With reference first to FIG. 1A, there is shown a simplified perspective view of a room, e.g., a data center 100, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove.

It should be readily apparent to those of ordinary skill in the art that the data center 100 depicted in FIG. 1A represents a generalized illustration and that other components may be added or existing components may be removed or modified without departing from the scope of the invention. For example, the data center 100 may include any number of racks and various other components. Thus, although the data center 100 is illustrated as containing four rows of racks 102-108, it should be understood that the data center 100 may include any number of racks, e.g., 100 racks, without departing from the scope of the invention. The depiction of four rows of racks 102-108 is thus for illustrative and simplicity of description purposes only and is not intended to limit the invention in any respect.

The data center 100 is depicted as having a plurality of racks 102-108, e.g., electronics cabinets, aligned in substantially parallel rows. The racks 102-108 are illustrated as having open front sides such that the components 118 housed therein are visible. It should, however, be understood that embodiments of the invention may be practiced with racks having panels that cover the front sides of the racks 102-108 without departing from the scope of the invention.

The rows of racks 102-108 are shown as containing four racks (a-d) positioned on a raised floor 110. A plurality of wires and communication lines (not shown) may be located in a space 112 beneath the raised floor 110. The space 112 may also function as a plenum for delivery of cooling fluid from an air conditioning unit 114 to the racks 102-108. The cooling fluid may be delivered from the space 112 to the racks 102-108 through vents 116 located between some or all of the racks 102-108. The vents 116 are shown as being located between racks 102 and 104 and 106 and 108.

The racks 102-108 are generally configured to house a plurality of components 118, e.g., computers, servers, monitors, hard drives, disk drives, etc., designed to perform various operations, e.g., computing, switching, routing, displaying, etc. These components 118 may comprise subsystems (not shown), for example, processors, micro-controllers, high-speed video cards, memories, semi-conductor devices, and the like to perform these functions. In the performance of these electronic functions, the components 118, and therefore the subsystems, may generally dissipate relatively large amounts of heat. Because the racks 102-108 have generally been known to include upwards of forty (40) or more subsystems, they may transfer substantially large amounts of heat to the cooling fluid to maintain the subsystems and the components generally within predetermined operating temperature ranges.

A relatively small number of components 118 are illustrated as being housed in the racks 102-108 for purposes of simplicity. It should, however, be understood that the racks 102-108 may include any number of components 118, e.g., forty or more components 118, without departing from the scope of the invention. In addition, although the racks 102-108 are illustrated as containing components 118 throughout the heights of the racks 102-108, it should be understood that some or all of the racks 102-108 may include slots or areas that do not include components 118 without departing from the scope of the invention.

Detecting devices 120 may be provided at various locations in the data center 100 to detect one or more environmental conditions. The surfaces and/or objects to which the detecting devices 120 are supported will be referred to as substrates for purposes of simplicity. The term "substrate", however, should not be construed as limiting these surfaces and/or objects in any respect. The detecting devices 120 may comprise relatively simple configurations designed to indicate the environmental condition(s) in either their relatively immediate vicinities or the temperatures of the substrates to which they are attached. The detecting devices 120 may detect environmental condition(s) in their vicinities without substantial interference from the substrates by implementation of the insulating pads 122 placed between the detecting devices 120 and the substrates, e.g., components, 18, racks 102-108, etc. The insulating pads 122 may comprise any known reasonably suitable pad capable of substantially preventing thermal transfer therethrough, e.g., STYROFOAM, ULTEM, plastic, insulating tape, or other insulating materials.

The detecting devices 120 are illustrated as being located at various positions throughout the data center 100. For instance, the detecting devices 120 are illustrated as being located at the outlets of the vents 116, at various locations with respect to the racks 102-108, and the inlet of the air conditioning unit 114. It should be understood that the locations of the detecting devices 120 illustrated in FIG. 1A are for illustrative purposes only and are not meant to limit the invention. Instead, it should be understood that the detecting devices 120 may be positioned at any reasonably suitable location where the environmental condition(s) are desired to be measured.

Figure 1B:
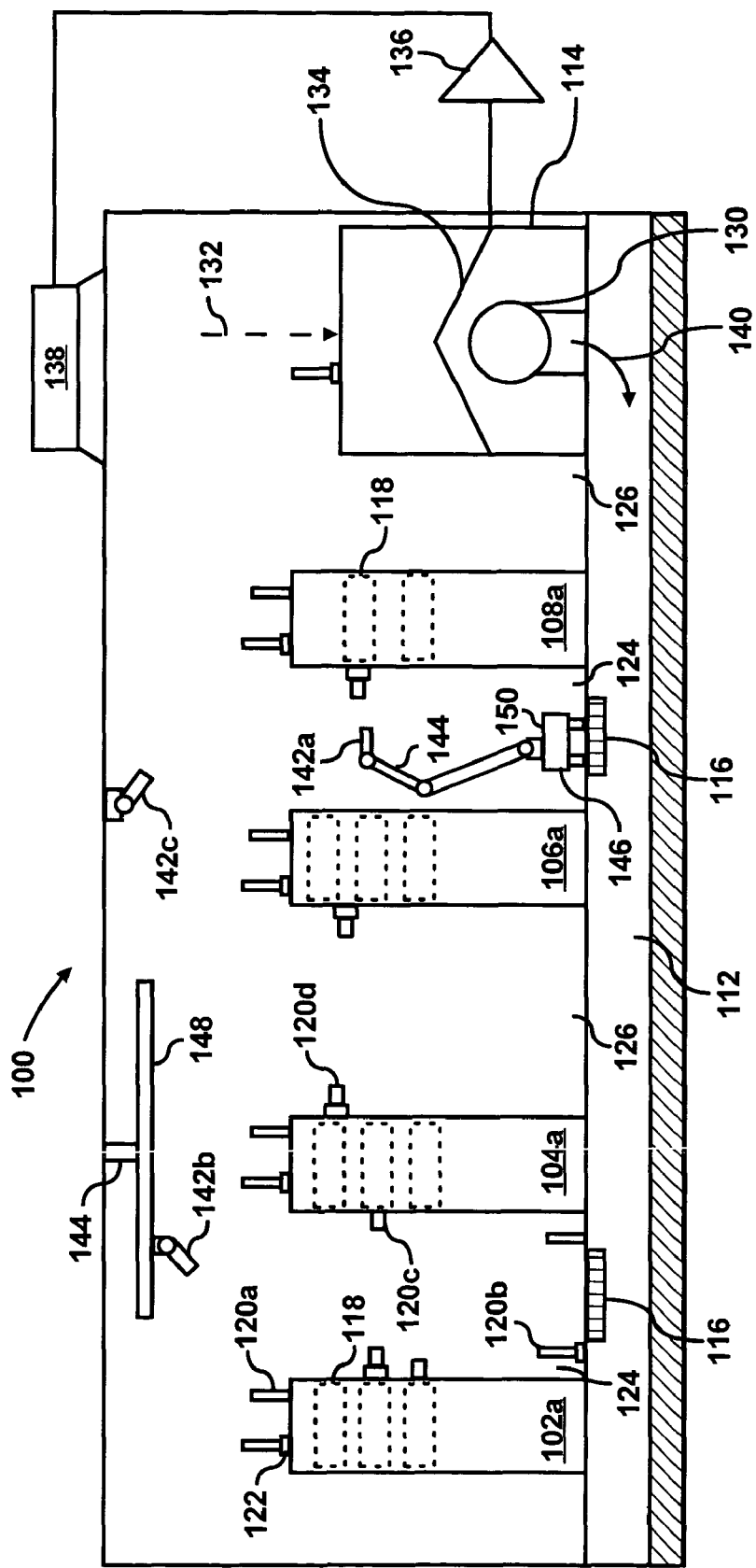
FIG. 1B shows a simplified illustration of a side elevational view of the data center shown in FIG. 1A, according to an embodiment of the invention.

With reference now to FIG. 1B, there is shown a simplified illustration of a side elevational view of the data center 100 shown in FIG. 1A, according to an embodiment of the invention. In FIG. 1B, racks 102a, 104a, 106a, and 108a are visible. In addition, some of the components 118 are visible in cross-section through the sides of the racks 102a, 104a, 106a, and 108a. A more detailed description of the embodiments illustrated with respect to FIG. 1B may be found in co-pending and commonly assigned U.S. application Ser. No. 09/970,707, filed on Oct. 5, 2001, which is hereby incorporated by reference in its entirety.

As shown in FIG. 1B, the areas between the racks 102 and 104 and between the racks 106 and 108 may comprise cool aisles 124. These aisles are considered "cool aisles" because they are configured to receive cooling fluid from the vents 116. In addition, the racks 102-108 generally receive cooling fluid from the cool aisles 124. The aisles between the racks 104 and 106, and on the rear sides of racks 102 and 108, are considered hot aisles 126. These aisles are considered "hot aisles" because they are positioned to receive air heated by the components 118 in the racks 102-108.

The sides of the racks 102-108 that face the cool aisles 124 may be considered as the fronts of the racks 102-108 and the sides of the racks 102-108 that face away from the cool aisles 124 may be considered as the rears of the racks 102-108. For purposes of simplicity and not of limitation, this nomenclature will be relied upon throughout the present disclosure to describe the various sides of the racks 102-108.

As described hereinabove, the air conditioning unit 114 receives and cools heated air. In addition, the air conditioning unit 114 supplies the racks 102-108 with air that has been cooled, e.g., cooling fluid, through, for example, a process as described below. The air conditioning unit 114 generally includes a fan 130 for supplying cooling fluid (e.g., air) into the space 112 (e.g., plenum) and/or drawing air from the data center 100 (e.g., as indicated by the arrow 132). In operation, the heated air enters into the air conditioning unit 114 as indicated by the arrow 132 and is cooled by operation of a cooling coil 134, a compressor 136, and a condenser 138, in a manner generally known to those of ordinary skill in the art. In terms of cooling system efficiency, it is generally desirable that the return air is composed of the relatively warmest portion of air in the data center 100.

Although reference is made throughout the present disclosure of the use of a fan 130 to draw heated air from the data center 100, it should be understood that any other reasonably suitable manner of air removal may be implemented without departing from the scope of the invention. By way of example, a fan (not shown) separate from the fan 130 or a blower may be utilized to draw air from the data center 100.

In addition, based upon the cooling fluid needed to cool the heat loads in the racks 102-108, the air conditioning unit 114 may be operated at various levels. For example, the capacity (e.g., the amount of work exerted on the refrigerant) of the compressor 136 and/or the speed of the fan 130 may be modified to thereby control the temperature and the amount of cooling fluid flow delivered to the racks 102-108. In this respect, the compressor 136 may comprise a variable capacity compressor and the fan 130 may comprise a variable speed fan. The compressor 136 may thus be controlled to either increase or decrease the mass flow rate of a refrigerant therethrough.

Because the specific type of compressor 136 and fan 130 to be employed with embodiments of the invention may vary according to individual needs, the invention is not limited to any specific type of compressor or fan. Instead, any reasonably suitable type of compressor 136 and fan 130 capable of accomplishing certain aspects of the invention may be employed with embodiments of the invention. The choice of compressor 136 and fan 130 may therefore depend upon a plurality of factors, e.g., cooling requirements, costs, operating expenses, etc.

It should be understood by one of ordinary skill in the art that embodiments of the invention may be operated with constant speed compressors and/or constant speed fans. In one respect, control of cooling fluid delivery to the racks 102-108 may be effectuated based upon the pressure of the cooling fluid in the space 112. According to this embodiment, the pressure within the space 112 may be controlled through operation of, for example, a plurality of vents 116 positioned at various locations in the data center 100. That is, the pressure within the space 112 may be kept essentially constant throughout the space 112 by selectively controlling the output of cooling fluid through the vents 116. By way of example, if the pressure of the cooling fluid in one location of the space 112 exceeds a predetermined level, a vent located substantially near that location may be caused to enable greater cooling fluid flow therethrough to thereby decrease the pressure in that location. A more detailed description of this embodiment may be found in U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 136, a heat exchanger (not shown) may be implemented in the air conditioning unit 114 to cool the fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 130 into the space 112 as indicated by the arrow 140. The cooling fluid flows out of the raised floor 110 and into various areas of the racks 102-108 through the plurality of vents 116. The vents 116 may comprise the dynamically controllable vents disclosed and described in co-pending U.S. application Ser. No. 09/970,707. As described in that application, the vents 116 are termed "dynamically controllable" because they generally operate to control at least one of velocity, volume flow rate and direction of the cooling fluid therethrough. In addition, specific examples of dynamically controllable vents 116 may be found in co-pending U.S. application Ser. No. 10/375,003, filed on Feb. 28, 2003, which is assigned to the assignee of the present invention and is incorporated by reference herein in its entirety.

As the cooling fluid flows out of the vents 116, the cooling fluid may flow into the racks 102-108. The racks 102-108 generally include inlets (not shown) on their front sides to receive the cooling fluid from the vents 116. The inlets generally comprise one or more openings to enable the cooling fluid to enter the racks 102-108. In addition, or alternatively, the front sides of some or all of the racks 102-108 may comprise devices for substantially controlling the flow of cooling fluid into the racks 102-108. Examples of suitable devices are described in co-pending and commonly assigned U.S. patent application Ser. Nos. 10/425,621 and 10/425,624, both of which were filed on Apr. 30, 2003, the disclosures of which are hereby incorporated by reference in their entireties.

The cooling fluid may become heated by absorbing heat dissipated from the components 118 located in the racks 102-108 as it flows through and around the racks 102-108. The heated air may generally exit the racks 102-108 through one or more outlets located on the rear sides of the racks 102-108. In addition, or alternatively, the rear sides of some or all of the racks 102-108 may comprise devices for substantially controlling the flow of cooling fluid into the racks 102-108 and/or controlling the flow of heated air out of the racks 102-108. Again, examples of suitable devices are described in co-pending and commonly assigned U.S. patent application Ser. Nos. 10/425,621 and 10/425,624.

The flow of air through the racks 102-108 may substantially be balanced with the flow of air through the vents 116 through operation of the above-described devices in manners consistent with those manners set forth in the above-identified co-pending applications. In addition, a proportional relationship may be effectuated between the airflow through the racks 102-108 and the vents 116. By virtue of controlling the airflow in the manners described in those co-pending applications, the level of re-circulation between the heated air flow and the cooling fluid may substantially be reduced or eliminated in comparison with known cooling systems.

The air conditioning unit 114 may vary the amount of cooling fluid supplied to the racks 102-108 as the cooling requirements vary according to the heat loads in the racks 102-108, along with the subsequent variations in the volume flow rate of the cooling fluid. As an example, if the heat loads in the racks 102-108 generally increases, the air conditioning unit 114 may operate to increase one or more of the supply and temperature of the cooling fluid. Alternatively, if the heat loads in the racks 102-108 generally decreases, the air conditioning unit 114 may operate to decrease one or more of the supply and temperature of the cooling fluid. In this regard, the amount of energy utilized by the air conditioning unit 114 to generally maintain the components in the data center 100 within predetermined operating temperature ranges may substantially be optimized.

As an alternative, there may arise situations where the additional cooling fluid flow to the racks 102-108 causes the temperatures of the components to rise. This may occur, for example, when a relatively large amount of heated air is re-circulated into the cooling fluid. In this situation, cooling fluid delivery may be reduced in response to increased component temperatures. In addition, cooling fluid delivery may be increased in response to decreased component temperatures. It should therefore be understood that the present invention is not limited to one operational manner as temperatures in the data center 100 vary.

Through operation of the vents 116, the above-described devices, and the air conditioning unit 114, global and zonal control of the cooling fluid flow and temperature may substantially be achieved. For instance, the vents 116 and the above-described devices generally provide localized or zonal control of the cooling fluid flow to the racks 102-108. In addition, the air conditioning unit 114 generally provides global control of the cooling fluid flow and temperature throughout various portions of the data center 100. By virtue of the zonal and global control of the cooling fluid, the amount of energy consumed by the air conditioning unit 114 in maintaining the components of the racks 102-108 within predetermined operating temperature ranges may substantially be reduced in comparison with conventional data center cooling systems.

The detecting devices 120 may be implemented to detect one or more environmental conditions, e.g., temperature, pressure, humidity, etc., at various locations throughout the data center 100. By way of example, a detecting device 120a may be positioned on top of the rack 102a to detect the temperature of the air at a location substantially directly above the rack 102a. In addition, an insulating pad 122 may be placed between the detecting device 120a and the rack 102a to substantially prevent heat from being transferred to the detecting device 120a from the rack 102a.

As another example, a detecting device 120b may be positioned to detect environmental condition(s) at an exhaust of a vent 116. Again, an insulating pad 122 may be placed between the detecting device 120b and the substrate upon which it is supported such that ambient condition(s) may be measured. As a further example, detecting devices 120c and 120d may be positioned to detect environmental condition(s) respectively at the inlet and the exhaust of the racks 102-108. FIG. 1B illustrates some of the possible locations where the detecting devices 120 may be positioned throughout the data center 100. It should however be understood that the locations of the detecting devices 120 illustrated in FIG. 1B are for illustrative purposes only and are not meant to limit the invention. Instead, it should be understood that the detecting devices 120 may be positioned at any reasonably suitable location where the environmental condition(s) are desired to be measured.

As generally set forth hereinabove, the detecting devices 120 are configured to measure one or more environmental conditions as well as to display the measured environmental condition. According to an embodiment, the detecting devices 120 may comprise liquid crystals configured to vary their appearances, e.g., color, based upon variations in one or more environmental conditions. By way of example, the liquid crystals may vary in color depending upon its temperature. According to another embodiment, the detecting devices 120 may comprise any reasonably suitable apparatus configured to detect an environmental condition and to display the detected environmental condition, e.g., conventional mercury thermometers, bi-metallic spring thermometers, and the like.

Reader devices 142a-142c are illustrated in FIG. 1B as being positioned to obtain information from the detecting devices 120. As shown in FIG. 1B, the reader device 142a is situated on an arm 144 of a robotic device 146, the reader device 142b is situated on a track 148, and the reader device 142c is attached to the ceiling of the data center 100. Although three possible locations of the reader devices 142a-142c are shown in FIG. 1B, it is within the purview of the present invention that the reader devices 142a-142c or other reader devices (not shown) may be located at various other locations of the data center 100 without departing from the scope of the invention. For example, one or more reader devices may be positioned on a wall or floor of the data center 100, on racks 102-108 or other components in the data center 100, etc. In addition, any number of reader devices positioned in any combination may be used to obtain information from the identification devices 120 without departing from the scope of the invention.

The robotic vehicle 146 may comprise a configuration and operate in manners similar to those described in co-pending and commonly assigned U.S. patent application Ser. No. 10/446,867 filed on May 29, 2003, and entitled "Data Center Robotic Device". The disclosure contained in that application is hereby incorporated by reference in its entirety. In one respect, the robotic vehicle 146 is generally composed of a vehicle base 150 having a plurality of wheels to enable travel of the robotic vehicle 146 through the data center 100. Attached to the vehicle base 150 is the arm 144 designed to rotate and be maneuvered into various positions with respect to the vehicle base 150, for example, with six or more degrees of freedom. The reader device 142a is attached to a free end of the arm 144 and is also movable with respect to the arm 144, for example, with four or more degrees of freedom.

The arm 144 and the reader device 142a may thus be maneuvered into various positions to image or otherwise obtain information from the detecting devices 120. More particularly, the reader device 142a may be positioned to obtain information from detecting devices 120 located at various heights as well as at various positions in the data center 100.

The reader device 142b is illustrated as being mounted on a track 148 attached to the ceiling of the data center 100 via a support 152. The reader device 142b may be substantially fixedly attached to the track 148. Alternatively, the reader device 142b may be attached in any known manner to enable the reader device 142b to traverse the longitudinal axis of the track 148. In addition, the reader device 142b may be configured to rotate into various positions with respect to the track 148, e.g., both in the plane of FIG. 1B and perpendicular to the plane of FIG. 1B. In this regard, the reader device 142b may be configured to obtain information from detecting devices 120 located at various positions throughout the data center 100. In addition, the track 148 may be configured to rotate about the support 152 to enable the reader device 142b to travel in the direction perpendicular to the plane of FIG. 1B.

The reader device 142c is illustrated as being supported on the ceiling of the data center 100. The reader device 142c may be substantially fixedly attached to the ceiling of the data center 100. Alternatively, the reader device 142c may be attached to the ceiling in any reasonably suitable manner to generally enable the reader device 142c to obtain information from a plurality of detecting devices 120 variously situated in the data center 100.

FIG. 1C is a cross-sectional side view of an upper portion of the data center 100 according to an embodiment of the invention. According to this embodiment, the data center 100 may include a lowered ceiling 162. Dynamically controllable returns 164 and 166 may be situated along the lowered ceiling 162 to generally enable controlled removal of heated air from the data center 100. To facilitate removal of heated air from the data center 100, the returns 164 and 166 may include a fan 170. A more detailed description of the returns 164 and 166 and manners of their operability may be found in co-pending U.S. application Ser. No. 10/262,879, filed on Oct. 3, 2002, which is assigned to the assignee of the present invention and is hereby incorporated by reference in its entirety.

As described in the Ser. No. 10/262,879 application, the space 168 between the lowered ceiling 162 and the ceiling of the data center 100 may function as a plenum through which heated air may be returned to the air conditioning unit 114.

Detecting devices 120e and 120f may be located in the respective vicinities of the returns 164 and 166. In this regard, the detecting devices 120e and 120f may be positioned to detect one or more environmental conditions in the vicinities of the returns 164 and 166. This information may be gathered by a reader device 142a-142c and utilized in the operational control of the returns 164 and 166 as described in the Ser. No. 10/262,879 application.

FIG. 1D is a cross-sectional side view of an upper portion of the data center 100 according to a further embodiment of the invention. According to this embodiment, heat exchanger units ("HEU") 172 and 174 may be provided in the data center 100. The HEU's 172 and 174 are disclosed and described in co-pending U.S. application Ser. No. 10/210,040, filed on Aug. 2, 2002, which is assigned to the assignee of the present invention and is hereby incorporated by reference in its entirety. As described in the Ser. No. 10/210,040 application, the HEU's 172 and 174 generally operate to receive heated air from the racks 102-108, cool the received air, and deliver the cooled air back to the racks 102-108 in a substantially controlled manner.

As also illustrated in FIG. 1D, detecting devices 120g-120i are illustrated in the vicinities of the HEU's 172 and 174. In this regard, the detecting devices 120g-120i may be positioned to detect one or more environmental conditions in the vicinities of the HEU's 172 and 174. In addition, one or more of the detecting devices 120g-120i may be attached to a substrate via an insulating pad 122. The environmental conditions detected by the detecting devices 120g-120i may be gathered by a reader device 142a-142c and utilized in the operational control of the HEU's 172 and 174 as described in the Ser. No. 10/210,040 application.

Figure 2A:
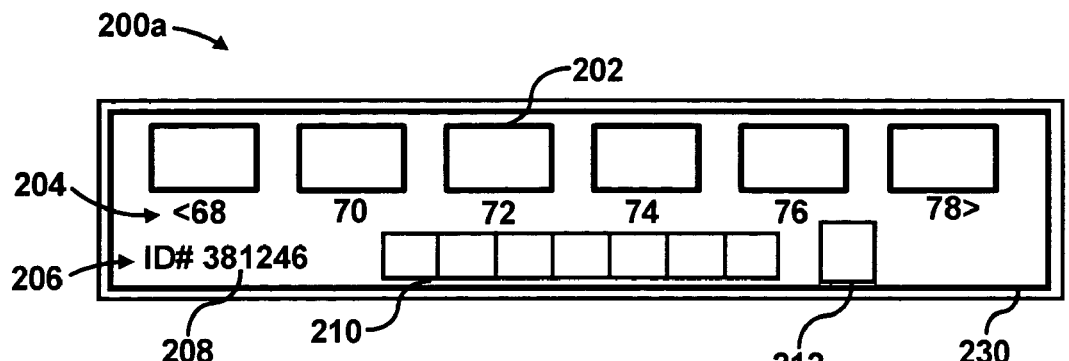
FIGS. 2A-2C illustrate detecting devices according to various embodiments of the invention.
Figure 2B:
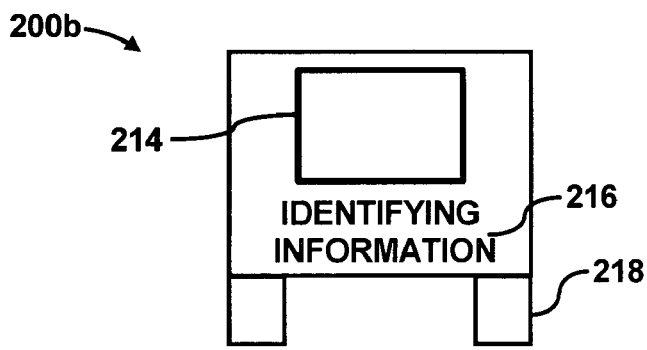
Figure 2C:
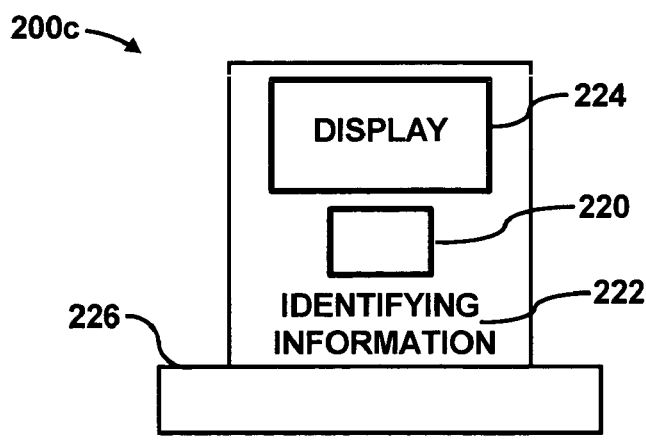

FIGS. 2A-2C illustrate detecting devices 200a-200c according to embodiments of the invention. The detecting devices 200a-200c depicted in FIGS. 2A-2C represent generalized illustrations and it should therefore be understood that the detecting devices 200a-200c may include additional features or existing features may be removed or modified or the general configurations of the detecting devices 200a-200c may be varied without departing from the scope of the invention. For example, the detecting device 200a may include any number of liquid crystal sensors and may include an insulating member for positioning between the detecting device 200a and a substrate.

The detecting devices 200a-200c may be attached to a substrate through any known reasonably suitable means. For example, the detecting devices 200a-200c may be affixed to the substrate with adhesive, welds, mechanical fasteners, etc. In the event that, for example, if the temperature of the substrate is desired to be measured, the connection between the detecting devices 200a-200c and the substrate may be made with thermally conductive material, e.g., thermal conductive adhesive, conductive metals, etc. On the other hand, if the ambient environmental condition(s) around the substrate is desired to be measured, the detecting devices 200a-200c may be attached via thermally insulating materials. The thermally insulating materials may include, for example, insulating foam adhesive, insulating plastics, and the like.

With reference first to FIG. 2A, the detecting device 200a is illustrated as having a generally rectangular configuration with a relatively flat front surface. The detecting device 200a may also comprise a relatively thin profile and may be attached along a rear surface thereof to a substrate. In addition, or alternatively, the detecting device 200a may be attached along any of its sides to the substrate.

The detecting device 200a is shown as including a plurality of thermal sensors 202. The thermal sensors 202 generally comprise temperature sensitive liquid crystal sheets which are designed to reflect different wavelengths of light, thereby changing its color, depending upon the surrounding environmental condition(s). A suitable liquid crystal sheet may be obtained from EDMUND INDUSTRIAL OPTICS of Barrington, N.J.

The thermal sensors 202 are illustrated as being aligned in a substantially horizontal configuration. Each of the thermal sensors 202 illustrated in FIG. 2A is designed to become activated, i.e., change color, when its temperature reaches a predetermined range. When the thermal sensors 202 are not activated, they may all appear to have the same color, e.g., black, gray, green, or the like. Thus, for instance, when the temperature of the detecting device 200a is 70° F., the thermal sensor 202 labeled "70" may change color and may thus indicate the temperature of the detecting device 200a.

The thermal sensors 202 may include temperature indicators 204 to generally denote the temperatures at which the thermal sensors 202 may become activated. The temperature indicators 204 may be provided to generally enable data center personnel with a means to determine the temperature of the detecting device 200a based upon the activated thermal sensor 202.

The detecting device 200a is illustrated as containing identifying information 206. The identifying information 206 is depicted as a serial number 208 to assist data center personnel in determining the identities of the detecting devices 200a. In one regard, the detecting devices 200a located throughout a data center 100 may be provided with substantially unique identities, e.g., serial numbers, to substantially distinguish the detecting devices from each other. Although not explicitly illustrated in FIG. 2A, the identifying information 206 may also include a barcode or other forms of identification without departing from the scope of the invention.

The identifying information 206 may also comprise color identity markers 210 which may be implemented to substantially uniquely distinguish the detecting device 200a from other detecting devices 200a. The color identity markers 210 of various detecting devices 200a may comprise a series of colors positioned in various sequences and/or arranged in substantially unique patterns. The reader device, e.g., reader devices 142a-142c, may be configured to locate the color patterns and determine the identities of the detecting devices 200a based upon the color identity marker 210 schemes.

The detecting device 200a is also illustrated as containing a color calibration patch 212 designed to aid the reader device, e.g., reader devices 142a-142c, in distinguishing the imaged colors of the thermal sensors 202. The reader device may image the color calibration patch 212 and implement the image in calibrating its algorithm for distinguishing the various colors of the thermal sensors 202.

With reference now to FIG. 2B, there is shown a detecting device 200b according to another embodiment of the invention. The detecting device 200b is illustrated as containing a single thermal sensor 214. The thermal sensor 214 of the detecting device 200b may comprise a liquid crystal sheet designed to change colors according to its temperature. Thus, for example, the thermal sensor 214 may appear as having a first color at a first temperature, a second color at a second temperature, and so forth. Again, a suitable liquid crystal sheet may be obtained from EDMUND INDUSTRIAL OPTICS of Barrington, N.J.

In addition, or alternatively, the detecting device 200b may comprise a thermally conductive material with relatively low heat capacity, e.g., metallic foil, and the thermal sensor 214 may comprise a coating on the thermally conductive material. In this instance, the thermal sensor 214 may comprise a thermal paint configured to change colors based upon the temperature of the detecting device 200b. A suitable thermal paint may be obtained from THERMAL PAINT TECHNOLOGIES, INC. of Cardiff, Calif.

The detecting device 200b is also illustrated as comprising identifying information 216. Although not explicitly illustrated in FIG. 2B, the identifying information 216 may comprise the serial number and/or color identity markers outlined above with respect to FIG. 2A.

The detecting device 200b is further depicted as being attached to a pair of insulating pads 218 spaced some distance apart from one another. The insulating pads 218 may comprise those materials described hereinabove with respect to the insulating pads 122. As also stated hereinabove, the insulating pads 218 may be positioned between the detecting device 200b and a substrate to thus substantially prevent thermal transfer between the substrate and the detecting device 200b. In this regard, the detecting device 200b may be implemented to detect one or more ambient environmental conditions around the substrate instead of the condition(s) of the substrate. As shown in FIG. 2B, the insulating pad 218 may comprise a substantially different configuration in comparison to the insulating pad 122 illustrated in FIGS. 1A and 1B.

FIG. 2C illustrates a detecting device 200c according to a third embodiment of the invention. The detecting device 200c is illustrated as containing a single thermal sensor 220 which may be similar to the thermal sensor 214 illustrated in FIG. 2B. The thermal sensor 220 of the detecting device 200c may thus comprise a liquid crystal sheet and/or a thermal paint designed to change colors according to its temperature.

The detecting device 200c may also include identifying information 222. Although not explicitly illustrated in FIG. 2C, the identifying information 222 may comprise the serial number and/or color identity markers outlined above with respect to FIG. 2A.

The detecting device 200c may further include a display 224, e.g., a liquid crystal display, configured to show, for example, the temperature of the detecting device 200c. In this instance, temperature measurements may be obtained from the thermal sensor 220 and shown on the display 224. In addition, or alternatively, the detecting device 200c may include a separate temperature sensor, e.g., thermocouple, thermistor, etc., which may obtain the temperature measurements shown on the display 224.

The detecting device 200c is further depicted as being attached to an insulating pad 226. The insulating pad 226 may comprise those materials described hereinabove with respect to the insulating pads 122. As also stated hereinabove, the insulating pad 226 may be positioned between the detecting device 200c and a substrate to thus substantially prevent thermal transfer between the substrate and the detecting device 200c. In this regard, the detecting device 200c may be implemented to detect one or more ambient environmental conditions around the substrate instead of the condition(s) of the substrate.

Although not shown in FIGS. 2B and 2C, the detecting devices 200b and 200c may also include the color calibration patch 212 shown in FIG. 2A. In addition, the detecting devices 200b and 200c may include the serial number indicia and other identifying information depicted in FIG.

2A. In addition, the detecting devices 200a-200c may also include a relatively distinct border, e.g., border 230 on FIG. 2A. The border may be implemented to enable a computer system to more readily locate and identify the detecting devices 200a-200c within an image. Thus, for example, the detecting devices 200a-200c positioned throughout a data center may include similar borders that the computer has been programmed to identify. It should be understood, however, that other forms of distinguishing the detecting devices 200a-200c from other components in the data center, e.g., materials having various reflective properties, colors of the detecting devices around the thermal sensors, etc., may be implemented without departing from the scope of the invention.

Figure 3A:
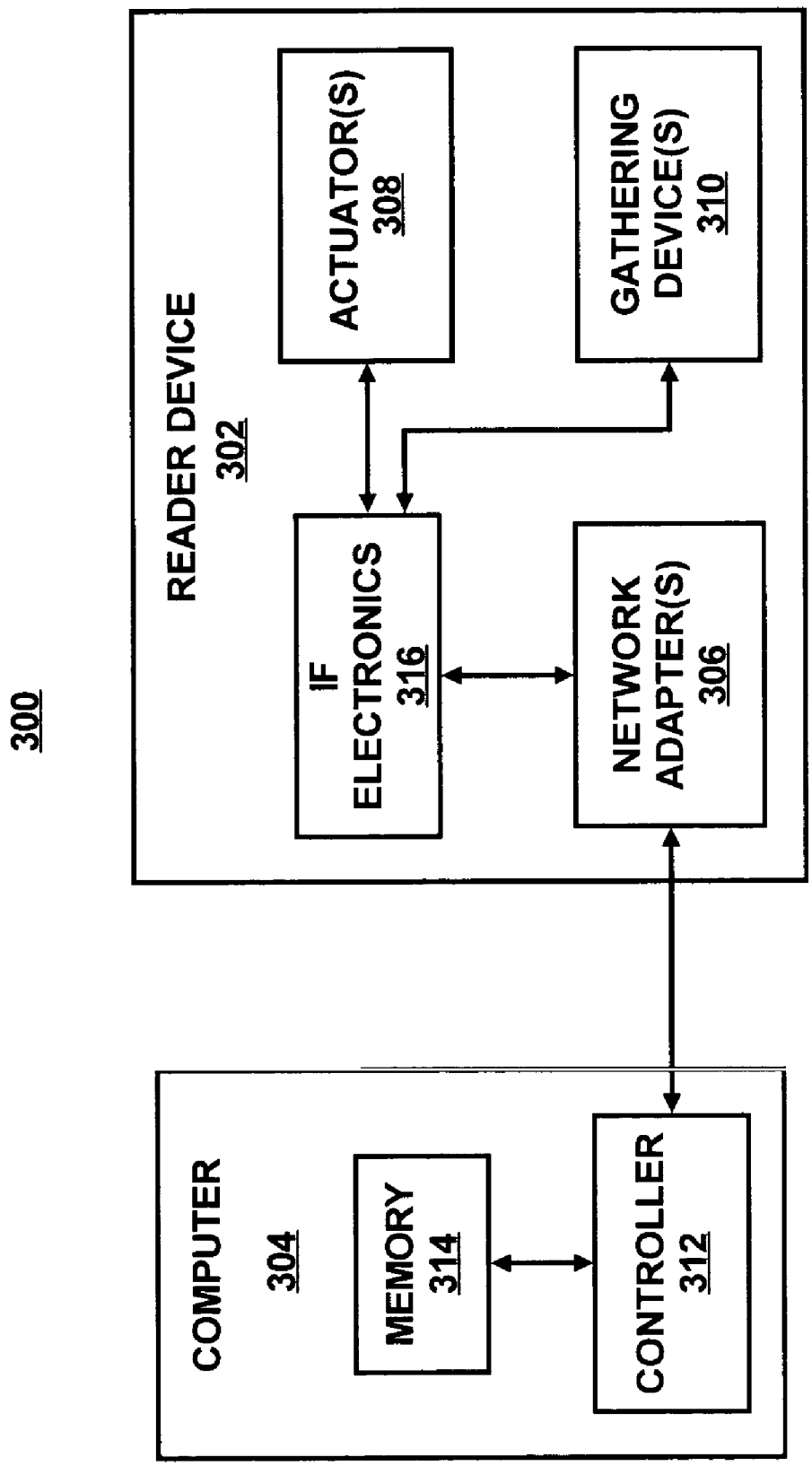
FIG. 3A is an exemplary block diagram for a reader device and a computer according to an embodiment of the invention.

FIG. 3A is an exemplary block diagram 300 for a reader device 302 and a computer 304 according to an embodiment of the invention. It should be understood that the following description of the block diagram 300 is but one manner of a variety of different manners in which such a reader device 302 and computer 304 may be configured. In addition, it should be understood that the reader device 302 and the computer 304 may each include additional components and that some of the components described herein may be removed and/or modified without departing from the scope of the invention.

The reader device 302 is interfaced with the computer 304 via one or more network adapter(s) 306. The network adapter(s) 306 may be configured to enable wired or wireless communication between the computer 304 and the reader device 302. In one regard, the reader device 302 may receive instructions from the computer 304 and may also transmit images or other data to the computer 304. More particularly, in the embodiment illustrated in FIG. 3A, the reader device 302 may receive operational instructions from the computer 304. That is, for example, the computer 304 may instruct the reader device 302 to position itself to obtain images or data from various sections of the data center.

The instructions may be received through the network adapter(s) 306 and implemented through one or more actuators 308, e.g., direct current (DC) motors, and the like, configured to manipulate the position of the reader device 302. Communications between the reader device 302 and the computer 304 may be effectuated through a wired protocol, such as IEEE 802.3, etc., or wireless protocols, such as IEEE 801.11b, 801.11g, wireless serial connection, Bluetooth, etc., or combinations thereof. The communications may include, for instance, with respect to the reader devices 142b and 142c illustrated in FIG. 1B, the actuator(s) 308 may articulate the reader devices 142b and 142c to face various directions in the data center 100. In addition, actuator(s) 308 may position the reader device 142b into various locations with respect to the track 148.

In addition, the reader device 302 may transmit or otherwise send the obtained images or data to the computer 304. The images or data may be obtained through one or more gathering devices 310. The gathering device(s) 310 may comprise any suitable device configured to gather information from the detecting devices 120. In this regard, the gathering device(s) 310 may comprise a camera configured to image the detecting devices 120.

In addition, or in the alternative, the gathering device(s) 310 may comprise infrared image sensors. The infrared image sensors may be implemented to detect the surface temperatures of substrates or thermally conductive materials located in the data center. In the instant case, substantially absolute temperature measurements may be obtained if the surface emissivities of the substrates are known. Otherwise, the infrared image sensors may measure the relative temperatures of similar surfaces.

According to this embodiment of the invention, the detecting devices 120 may comprise metallic foils. Through knowledge of the surface emmisivity of the metallic foils, the infrared image sensors may determine the temperatures of the detecting devices 120.

The computer 304 is illustrated as containing a controller 312 and a memory 314. The controller 312 is configured to control the operations of the reader device 302. As stated hereinabove, the controller 312 may control operations of the actuator(s) 308 and the gathering device(s) 310. The controller 312 may thus comprise a microprocessor, a microcontroller, an application specific integrated circuit (ASIC), and the like.

The instructions from the controller 312 may also be sent through interface electronics 316. The interface electronics 316 may be provided to act as an interface between the controller 312 and the actuator(s) 308 and the gathering device(s) 310. By way of example, the interface electronics 316 may vary the voltage supplied to the actuator(s) 308 to thereby vary the position of the reader device 302.

The controller 312 may also be interfaced with the memory 314. The memory 314 may be configured to provide storage of a computer software that provides the functionality of the reader device 302 and the computer 304. The memory 314 may be implemented as a combination of volatile and non-volatile memory, such as DRAM, EEPROM, flash memory, and the like. The memory 314 may also be configured to provide a storage for containing data/information pertaining to the manner in which the actuator(s) 308 may be manipulated in response to, for example, an instruction to obtain information from one or more detecting devices 120.

In one respect, the memory 314 may store data/information pertaining to timing operations and information gathering algorithms responsive to various input. The controller 312 may operate the actuator(s) 308 in manners relative to the data/information stored in the memory 314 in response to the input. In another respect, the memory 314 may store the images and/or information pertaining to the data received from the reader device 302. For instance, the memory 314 may store the identifications of the detecting devices 120 along with their associated locations in the data center 100.

Although the computer 304 is illustrated as communicating with a single reader device 302, it is within the purview of the invention that the computer 304 may send instructions to and receive information from a plurality reader devices 302 without departing from the scope of the invention.

According to an embodiment of the invention, communication between the computer 304 and the reader device 302 may be effectuated through location aware devices as described in co-pending and commonly assigned U.S. patent application Ser. No. 10/620,272, filed on Jul. 9, 2003, entitled "LOCATION AWARE DEVICES", the disclosure of which is hereby incorporated by reference in its entirety. As described in that application, these devices are termed "location aware" because they are operable to determine their general locations with respect to other sensors and/or devices and to communicate with one another through wireless communications.

Although the reader device 302 and the computer 304 have been illustrated as two separate components in FIG. 3A, it should be understood that the reader device 302 and the computer 304 may be formed as a single component without departing from the scope of the invention. In this regard, the reader device 302 may have a controller and a memory configured to control its operation.

Figure 3B:
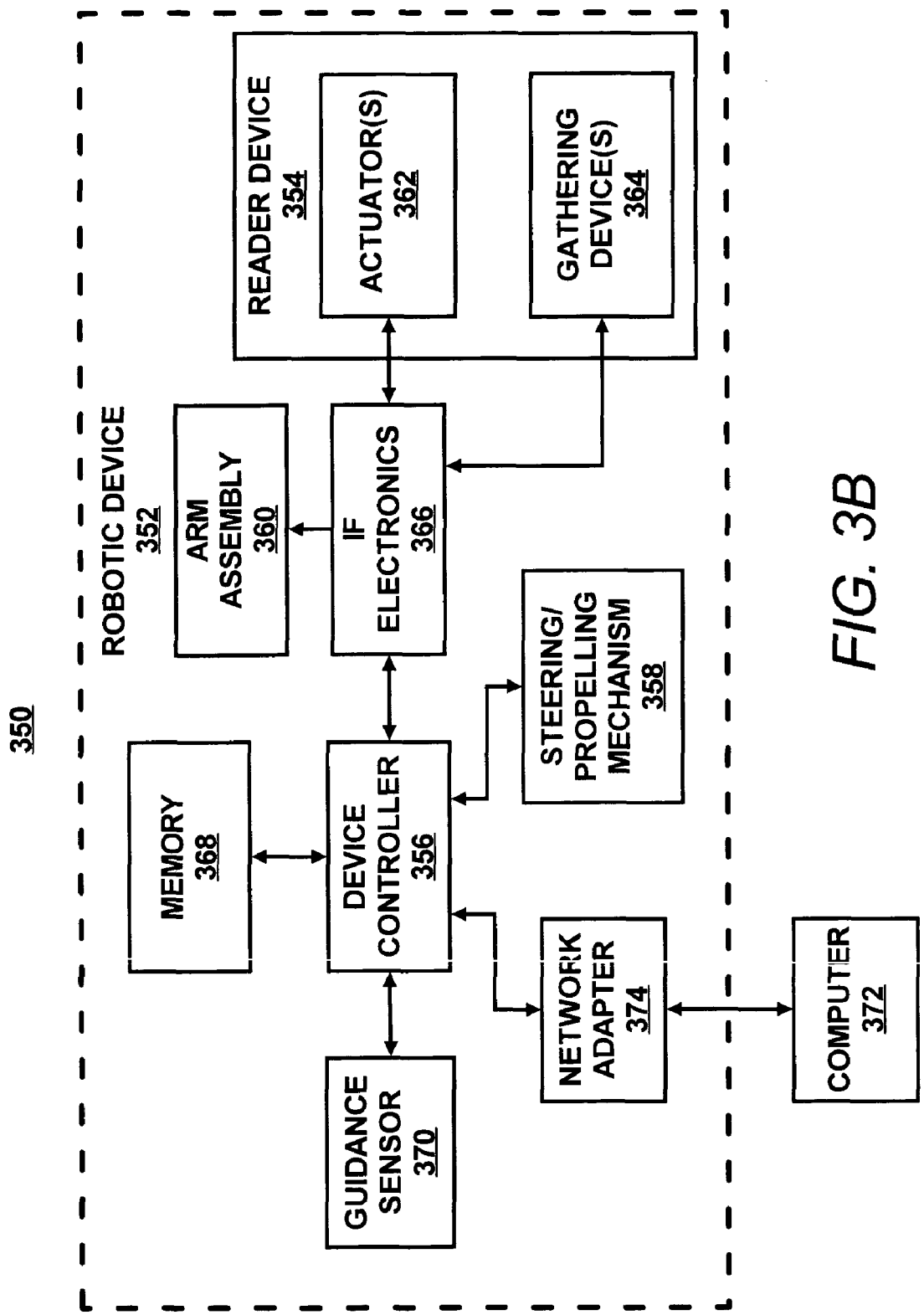
FIG. 3B is an exemplary block diagram for a robotic device having a reader device according to an embodiment of the invention.

FIG. 3B is an exemplary block diagram 350 for a robotic device 352 having a reader device 354 according to an embodiment of the invention. It should be understood that the following description of the block diagram 350 is but one manner of a variety of different manners in which such a robotic device 352 and reader device 354 may be configured. In addition, it should be understood that the robotic device 352 and the reader device 354 may include additional components and that some of the components described may be removed and/or modified without departing from the scope of the invention.

The robotic device 352 may comprise the configuration of the robotic device 146 and the reader device 352 may comprise the configuration of the reader device 142a illustrated in FIG. 1B. Thus, the robotic device 352 may include an arm assembly 360 along with associated actuators configured to maneuver the arm assembly 360 into various positions.

The robotic device 352 includes a device controller 356 configured to control the operations of the robotic device 352. By way of example, the device controller 356 may control the reader device 354, a steering/propelling mechanism 358, and an arm assembly 360. The device controller 356 may thus comprise a microprocessor, a micro-controller, an application specific integrated circuit (ASIC), and the like.

The arm assembly 360 may comprise actuators configured to manipulate the arm assembly into various positions. The reader device 354 may be positioned near a free end of the arm assembly 360 and its position may be varied through movement of the arm assembly 360. In one regard, the position of the reader device 354 may be varied to enable the reader device to image detecting devices 120 situated at various locations of the data center 100.

The reader device 354 may also include one or more actuators 362 for articulating the reader device 354 with respect to the robotic device 352. The actuators of the arm assembly 360 and the actuator(s) 362 of the reader device 354 may comprise direct current (DC) motors.

The reader device 354 may contain one or more gathering devices 364 for gathering information from the detecting devices 120. In this regard, the gathering device(s) 364 may comprise a camera, e.g., analog, digital, infrared image sensor, etc., configured to image the detecting devices 120. The images obtained by the gathering device(s) 364 may be transmitted or otherwise sent to the device controller 356. Communications between the reader device 354 and the device controller 356 may also be effectuated through a wired protocol, such as IEEE 802.3, etc., or wireless protocols, such as IEEE 801.11b, 801.11g, wireless serial connection, Bluetooth, etc., or combinations thereof.

The instructions from the device controller 356 may also be sent through interface electronics 366. The interface electronics 366 may be provided to act as an interface between the controller 354 and the actuator(s) 362 and the gathering device(s) 364. By way of example, the interface electronics 366 may vary the voltage supplied to the arm assembly 360 to thereby articulate of the reader device 352 into various positions.

The steering/propelling mechanism 358 may be configured to control the motivation and direction of travel for the robotic device 352. The steering/propelling mechanism 352 may thus comprise actuators configured to vary these aspects of the robotic device 352 travel.

The device controller 356 may also be interfaced with a memory 368 configured to provide storage of a computer software that provides the functionality of the robotic device 352 and the reader device 354. The memory 368 may be implemented as a combination of volatile and non-volatile memory, such as DRAM, EEPROM, flash memory, and the like. The memory 368 may also be configured to provide a storage for containing data/information pertaining to the manner in which the arm assembly 360 and the actuator(s) 362 may be manipulated in response to, for example, an instruction to image one or more detecting devices 120.

In one respect, the memory 368 may store data/information pertaining to various operations and information gathering algorithms responsive to various inputs. For example, the device controller 356 may operate the robotic device 352 to travel to various areas of the data center 100 in response to input received instructing the robotic device 352 to image detecting devices 120 located in those various areas. The input may be an instruction received from a user, based upon an elapsed time, etc. According to an embodiment, the memory 368 may store the location information for the detecting devices 120, e.g., as a map, coordinate locations, etc.

In addition, the device controller 356 may access the memory 368 to determine manners in which the reader device 354 is to be operated in response to receipt of various inputs. For example, the device controller 356 may operate the reader device 354 to obtain images from one or more detecting devices 120 by actuating the reader device 354 into position to obtain image the one or more detecting devices 120. Moreover, the memory 368 may contain an algorithm configured to control operation of the gathering device(s) 364 when the reader device 354 is positioned to image the one or more detecting devices 120.

The reader device 354 may also transmit or otherwise send the information obtained from the detecting device(s) 120 to the device controller 356. The device controller 356 may store this information in the memory 368. For instance, the memory 368 may store the identification information of the detecting device(s) 120 and the temperature measurements obtained from the images of the detecting device(s) 120. The memory 368 may store this information in the form of a table, map, etc.

The device controller 356 may also receive information from a guidance sensor 370, e.g., a laser guidance tool, sonar tool, a camera assembly, combinations thereof, and the like, configured to detect the distances of objects located within the field of view of the guidance sensor 370. The received information may be in the form of detected positions of objects located around the robotic device 352. The information obtained by the guidance sensor 370 may be transmitted or otherwise sent to a user who may operate the robotic device 352 to avoid, for example, objects located in the path of the robotic device 352. In addition, or as an alternative, the device controller 356 may process the images, e.g., with image recognition software. In this regard, the device controller 356 may determine the objects located within the guidance sensor's 370 field of view, whether the object is an avoidable obstacle, and determine a path around the obstacle if it is avoidable.

The device controller 356 may communicate with a computer 372 via a network adapter 374. The computer 372 may comprise the configuration of the computer 304 illustrated in FIG. 3A. The network adapter 374 may be configured to enable wired or wireless communication between the device controller 356 and the computer 372. In one regard, the device controller 356 may receive instructions from the computer 372 and may also transmit images or other data to the computer 372.

In addition, a user may implement the computer 372 to control the operations of the robotic device 352. For instance, a user may control the travel of the robotic device 356 as well as the arm assembly 360, and the reader device 354 by sending instructions to the device controller 356 via the computer 372. Moreover, the computer 372 may receive the information obtained by the gathering device(s) 364 and store this information in its memory.

Although a single robotic device 352 and a single reader device 354 are illustrated in FIG. 3B as communicating with the computer 372, it should be understood that a plurality of robotic devices 352 and reader devices 354 may communicate with the computer 372 without departing from the scope of the invention. In one regard, the computer 372 may receive information from a plurality of reader devices 354, either located on robotic devices 352 or otherwise situated in the data center 100. In this instance, the reader devices 354 may substantially concurrently obtain images of detecting devices 120 located in various sections of the data center 100. The computer 372 may compile the received information in a readily accessible form such that the temperature distributions throughout the data center may be relatively easily determined.

According to an embodiment of the invention, and as described hereinabove with respect to co-pending U.S. patent application Ser. No. 10/620,272, the robotic device 352 may include a location aware device. In addition, location aware devices may be positioned at various locations of the data center 100. Through use of location aware devices as described in that application, the device controller 356 may determine its location with respect to the other location aware devices. In addition, the device controller 356 may wirelessly receive information from the other location aware devices.

Figure 4A:
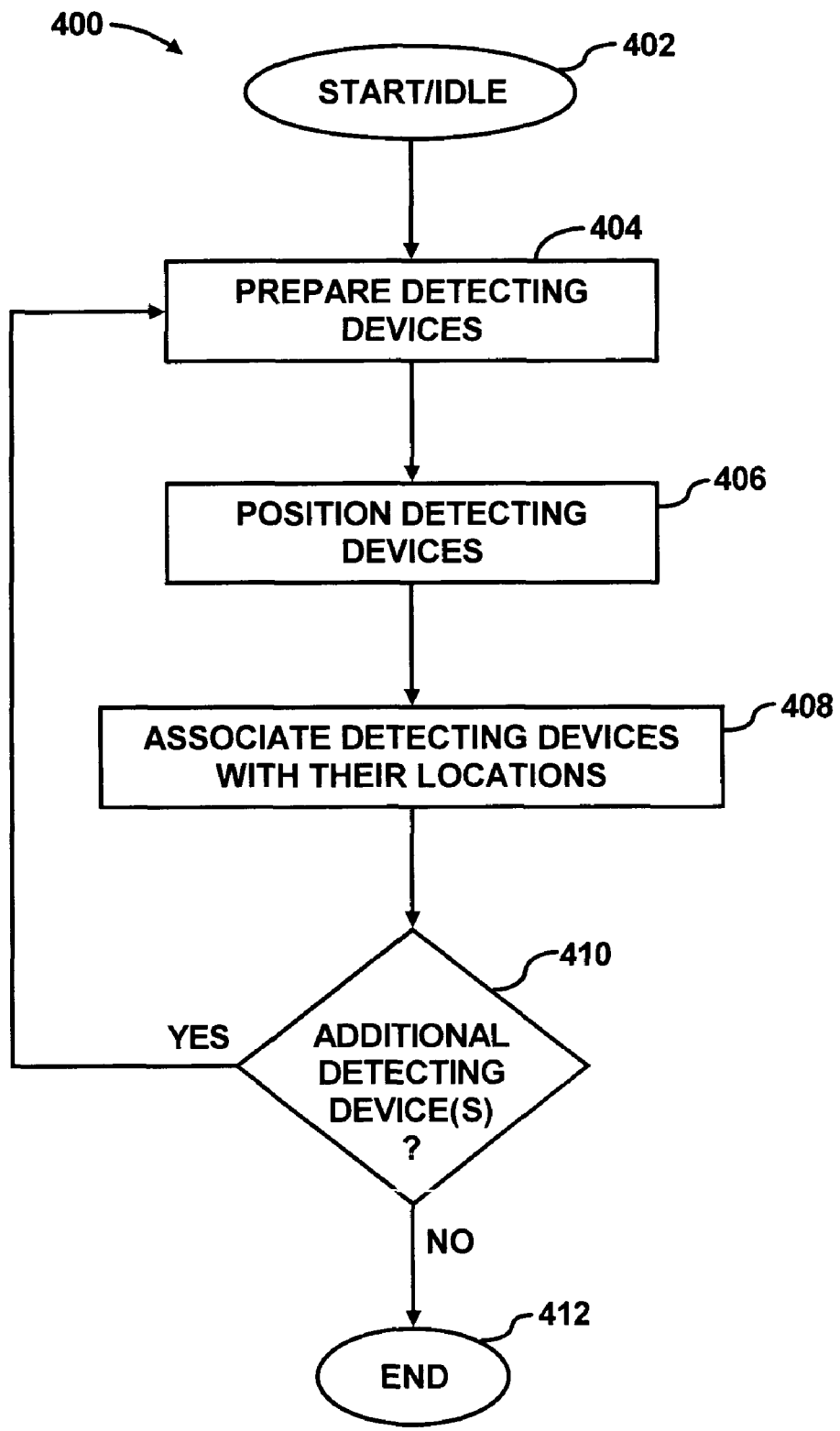
FIGS. 4A and 4B, collectively, illustrate an exemplary flow diagram of an operational mode of a system for determining environmental conditions according to an embodiment of the invention.
Figure 4B:
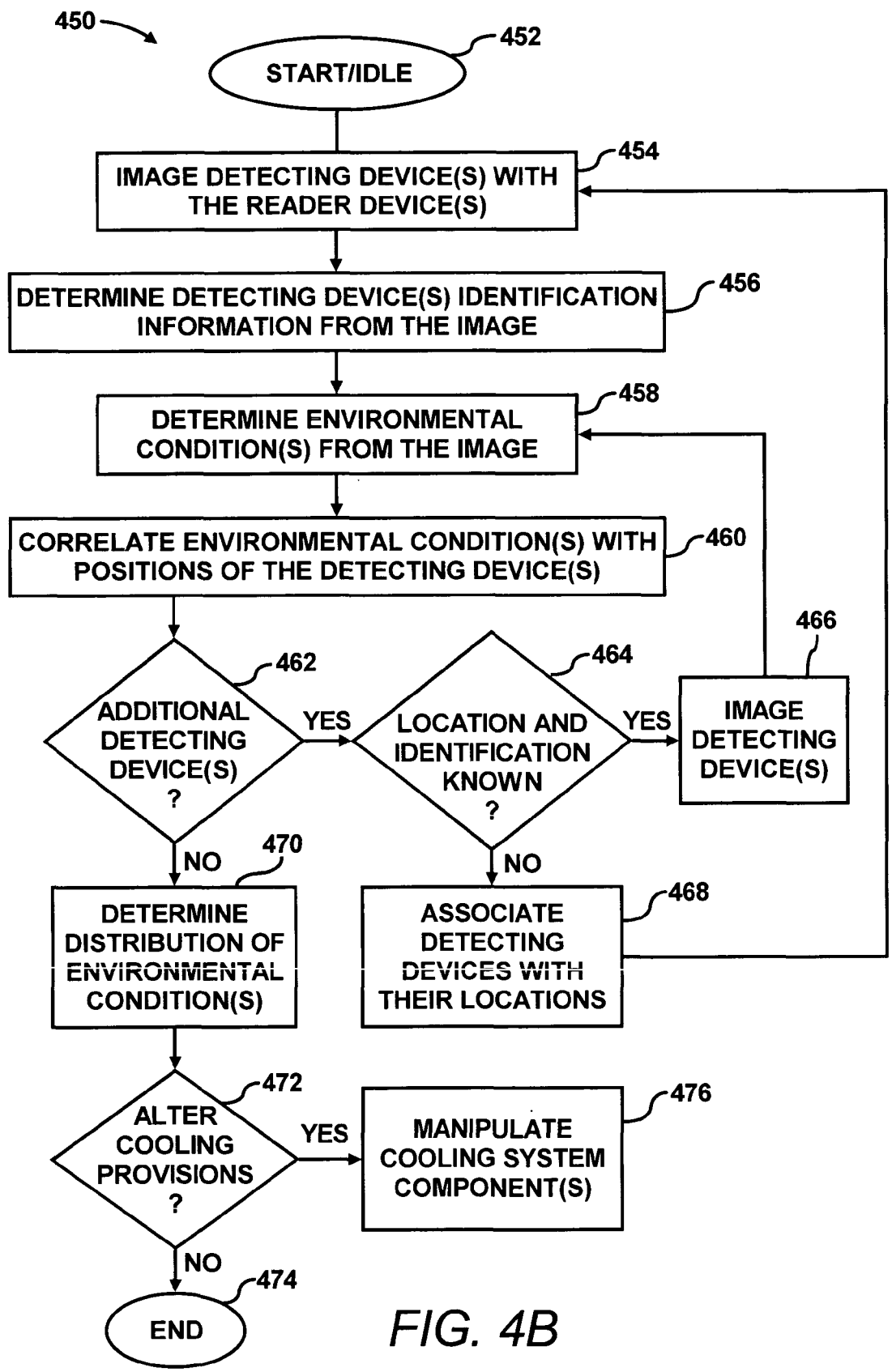

FIGS. 4A and 4B, collectively, illustrate an exemplary flow diagram of an operational mode 400 and 450 of a system for determining environmental conditions according to an embodiment of the invention. It is to be understood that the following description of the operational modes 400 and 450 are but one manner of a variety of different manners in which an embodiment of the invention may be operated. It should also be apparent to those of ordinary skill in the art that the operational modes 400 and 450 represent a generalized illustration and that other steps may be added or existing steps may be removed, modified or rearranged without departing from the scope of the invention. The description of the operational modes 400 and 450 are made with reference to the block diagrams 300 and 350 illustrated in FIGS. 3A and 3B, respectively, and thus makes reference to the elements cited therein. It should, however, be understood that the operational modes 400 are not limited to the elements set forth in the block diagrams 300 and 350.

With reference first to FIG. 4A, there is illustrated an operational mode 400 for establishing detecting devices, e.g., detecting devices 120, in a room, e.g., data center 100. The operational mode 400 may be initiated in response to a variety of stimuli at step 402. For example, the operational mode 400 may be initiated in response to a predetermined lapse of time, in response to receipt of a transmitted signal, manually initiated, etc.

At step 404, the detecting devices may be assigned with serial numbers and/or other forms of identification to differentiate the various detecting devices from each other. As stated hereinabove, the other forms of identification may include the use of color identity markers and barcodes.

At step 406, the detecting devices may be positioned at various locations throughout the data center where environmental conditions are to be measured. As indicated in FIGS. 1A and 1B, the detecting devices may be positioned at various positions with respect to the racks 102-108, at the vent 116 exhausts, at the inlet of the air conditioning unit 114, etc. In addition, the detecting devices may be either attached directly to the substrates or a thermally insulating pad may be positioned between the detecting devices and the substrates. The detecting devices may also be positioned on or in the vicinities of the components 118 to detect one or more environmental conditions of the components 118 or the air around the components 118.

The detecting devices may be associated with their respective locations at step 408. That is, for example, the identification information of the detecting devices may be correlated with their locations. The correlation may be in the form of, for example, a table, chart, map, etc., and stored in a database, e.g., memory 314, 368, to thus enable relatively easy determination of the locations of specific detecting devices.

In another respect, at step 408, the detecting devices may be correlated with the cooling system components, e.g., air conditioning unit, vent tiles, etc., that affect their temperatures. For instance, at step 408, a calibration routine may be implemented to determine how air flow from various air conditioning units 114 and vent tiles 116 affect the variously positioned detecting devices. This information may be stored in a memory, e.g., cooling system memory 512, for access by a cooling system controller 504 in determining manners in which to manipulate the cooling system components in response to various detected conditions.

At step 410, it may be determined whether one or more detecting devices have been added to the data center. A user may determine whether additional detecting device(s) have been added in the data center, e.g., the person who installed the additional detecting device(s). In addition, or alternatively, an image of the data center may indicate that an additional detecting device(s) has been added if it is determined that the identification information of the additional detecting device(s) is not included in the database. Step 410 may thus be performed by data center personnel or it may be performed by a computer with access to the database. If it is determined that additional detecting device(s) have been installed in the data center, one or more of steps 404-408 may be repeated for those additional detecting devices(s). More particularly, if the user installs an additional detecting device(s), steps 404-408 may be repeated. Alternatively, if the detecting device has already been installed and the computer identifies the additional detecting device(s), steps 404 and 406 may be omitted.

Alternatively, if no additional detecting device(s) are determined to have been installed in the data center, the operational mode 400 may end as indicated at step 412. Step 412 may be equivalent to an idle mode since steps 404-410 may be repeated when new detecting device(s) are installed or otherwise detected in the data center.

According to an embodiment of the invention, data center personnel may perform the operational mode 400. In addition, or alternatively, a robotic device may be implemented to perform the operational mode 400. For example, the robotic device may be programmed to prepare, attach and associate the detecting devices with their respective locations. In this regard, the robotic device may be programmed to traverse the data center and position the detecting devices according to their designated locations.

With reference now to FIG. 4B, there is illustrated an operational mode 450 for determining environmental condition distribution in a data center according to an embodiment of the invention. The operational mode 450 may be initiated in response to a variety of stimuli at step 452. For example, the operational mode 450 may be initiated in response to a predetermined lapse of time, in response to receipt of a transmitted signal, manually initiated, etc. In addition, the operational mode 450 may be repeated on a substantially continuous basis.

One or more reader devices, e.g., reader devices 142a-142c, may obtain one or more images of various sections of the data center or particular detecting devices at step 454. More particularly, for example, the reader devices 142b and 142c may be instructed and operated to image sections of the data center where the detecting devices are known to be located. One or more detecting devices may be imaged during imaging of these various sections of the data center. As another example, the reader device 142a located on the robotic device 146 may be operated to image a single detecting device as illustrated in FIG. 1B.

If the reader device comprises the reader devices 142b and/or 142c illustrated in FIG. 1B, the reader device may be articulated into position to image various sections of the data center. As set forth above, articulation of the reader device may comprise adjusting the angle of the reader device and/or re-positioning the reader device on a track.

If the reader device, e.g., reader device 354, is positioned on a robotic device, e.g., robotic device 352, the robotic device may be configured to travel through data center to image detecting devices located at various locations of the data center. The route that the robotic device follows may be predetermined and stored in the memory 368. In addition, or alternatively, a user may control the operation of the robotic device through, e.g., the computer 372. The route may be selected according to the locations of the detecting devices where the environmental condition information is to be obtained. Thus, for example, if the environmental conditions at substantially the entire area of the data center are to be determined, the robotic device may follow a route that causes the robotic device to travel through almost the entirety of the data center. Alternatively, if a relatively few areas are to be checked, the robotic device may be configured to travel to the locations of those area. In addition, the path of the robotic device may be chosen such that the travel time is minimized or the path may comprise a substantially unimpeded path.

If the robotic device 352 is implemented to perform various embodiments of the invention, the robotic device 352 may be operable to determine the locations of the detecting devices. The locations may be determined through a correlation of the robotic device 352 location and the location of the detecting device. In one instance, the robotic device 352 may have access to a map to thus know its location within the data center. Alternatively, the robotic device 352 may employ a global positioning system to track its location or the robotic device 352 may implement location aware devices to track its location. In any regard, it should be understood that step 408 of FIG. 4A may be performed by the robotic device 352.

At step 456, the identification information of the one or more detecting devices located in the image obtained at step 454 may be determined. That is, the controller, e.g., controller 312, 356, may determine the detecting devices located within the image. As stated hereinabove, the controller may distinguish the detecting devices from other components located in the image through image recognition software. In addition, the recognition process may be aided by providing the detecting devices with relatively distinctive characteristics, e.g., borders, colors, texture, etc.

The controller may determine the identification information on the detecting devices in a variety of different manners as indicated hereinabove. For instance, the controller may access image recognition software designed read and comprehend serial numbers and/or barcodes placed on the detecting devices. As another example, the identification information may be in the form of various color combinations. In any regard, the controller may store the identification information in a memory, e.g., memory 314, 368.

At step 458, the controller may determine the environmental condition(s) through interpretation of the colors of the detecting device thermal sensors. In this regard, the controller may access a chart or otherwise may have stored in a memory, the various environmental conditions correlating to the colors of the thermal sensors. In addition, the color-temperature correlation may be determined based upon the thermal sensor manufacturer's specification or they may be determined through any known reasonably suitable calibration process.

The controller may correlate the detected environmental condition(s) with the positions of the detecting device(s) as indicated at step 460. The correlation between the environmental condition(s) and the detecting device(s) locations may be stored in any reasonably suitable form, e.g., graphically in two or three dimensions, Table 1 below, etc.

TABLE 1

| Detecting Device ID. | Location (row, col.) | Temperature ° C. |
| --- | --- | --- |
| Abc123 | 1, 1 | 25 |
| Def456 | 1, 2 | 27 |
| Ghsi432 | 1, 3 | 22 |
| Ghei58 | 1, 4 | 29 |
| Hceh439 | 2, 1 | 32 |

As seen in Table 1 above, the detecting devices have been assigned serial numbers as a means of distinguishing them from one another. It should, however, be understood that other forms of distinguishing the detecting devices may be employed without departing from the scope of the invention. For instance, color identification markers may be implemented and the detecting devices may be tracked according to those markers.

In addition, the locations of the detecting devices have been listed in accordance with their locations with respect to the locations of various rack coordinates. Thus, for instance, the detecting device having the serial number "Abcd12" is located near the rack located in the first row of racks and in the first column of that first row.

The locations of the detecting devices may also be listed according to their respective heights from a reference location, e.g., the floor of the data center. In this regard, by knowing the heights of the racks, the relative locations of the detecting devices may be determined. As a further alternative, the locations of the detecting devices may be tracked according to their coordinate locations, e.g., in the x, y, and z-axes, within the data center.

The serial numbers for the detecting devices are listed in alphanumeric text in Table 1. It should, however, be understood that the serial numbers may comprise any reasonably suitable manner of identification. For example, numerals, letters, names, symbols, and the like, may be employed to identify the detecting devices.

At step 462, it may be determined whether the environmental condition(s) at the intended areas have been determined. If additional environmental condition information is needed or desired, it may be determined whether the detecting devices in those remaining intended areas have been identified and whether their locations are known at step 464. If the locations of the detecting device(s) and their identities are known, one or more reader devices may be operated to obtain one or images of the remaining areas and/or detecting devices at step 466. Steps 458-462 may be repeated for the image(s) obtained at step 466.

If one or more of the locations and identification information are unknown for those remaining detecting devices, the remaining detecting devices may be associated with their locations at step 468. In addition, the remaining detecting devices may be assigned serial numbers at step 468 if this was not previously done. Steps 454-462 may be repeated for the remaining detecting devices.

Referring back to step 462, if it is determined that there are no further areas where environmental condition detection is desired, the controller may determine the distribution of environmental conditions at the detected areas of the data center at step 470. The environmental condition distribution may be determined through an analysis of the correlation between the detected environmental condition(s) and the locations of the detecting devices. That is, for example, the controller may analyze the information contained in Table 1 or it employ that data to create a two or three-dimensional representation of the environmental condition distribution. In any respect, the controller may determine whether there are areas in the data center where the detected environmental condition(s) are outside of predetermined ranges, e.g., nominal operating ranges. For instance, where there exists areas in the data center that may be receiving insufficient amounts of cooling fluid, e.g., hot spots.

The predetermined ranges may be defined as predetermined ranges of operating temperatures for the components 118, e.g., between a maximum set point temperature (Tmax, set) and a minimum set point temperature (Tmin,set). In general, the range of temperatures between Tmin,set and Tmax,set pertains to threshold temperatures that the controller may use to determine whether to increase or decrease the flow of cooling fluid delivered to the components. This range of operating temperatures may be set according to a plurality of factors. These factors may include, for example, the operating temperatures set forth by the manufacturers of the components, through testing to determine the optimal operating temperatures, etc. In addition, the predetermined range of operating temperatures may vary from one component to another.

Based substantially upon the distribution of environmental condition(s), the controller may determine whether the cooling system distribution, e.g., distribution of cooling fluid, removal of heated air, air conditioning unit operation, etc., should be altered at step 472. If the controller determines that the environmental condition(s) in the various detected areas of the data center are within predetermined ranges, the operational mode 450 may end as indicated at step 474. Step 474 may be equivalent to an idle mode since steps 454-472 may be repeated when new detecting device (s) are installed or otherwise detected in the data center, or when the controller initiates the operational mode 450, e.g., in response to a manual instruction, at a predetermined time, etc.

If the controller determines that the environmental condition(s) in one or more areas of the data center are outside the predetermined ranges, the controller may cause one or more components of the cooling system, i.e., vent tiles, air conditioning unit, etc., to vary the distribution of cooling fluid, the temperature of the cooling fluid, and/or the removal of heated air, to those areas at step 476. In one respect, determination of the cooling system components to be manipulated may substantially be based upon the association between the detecting devices and the cooling system components performed at step 408. Various manners of varying cooling system operations is set forth in greater detail hereinbelow.

Figure 5:
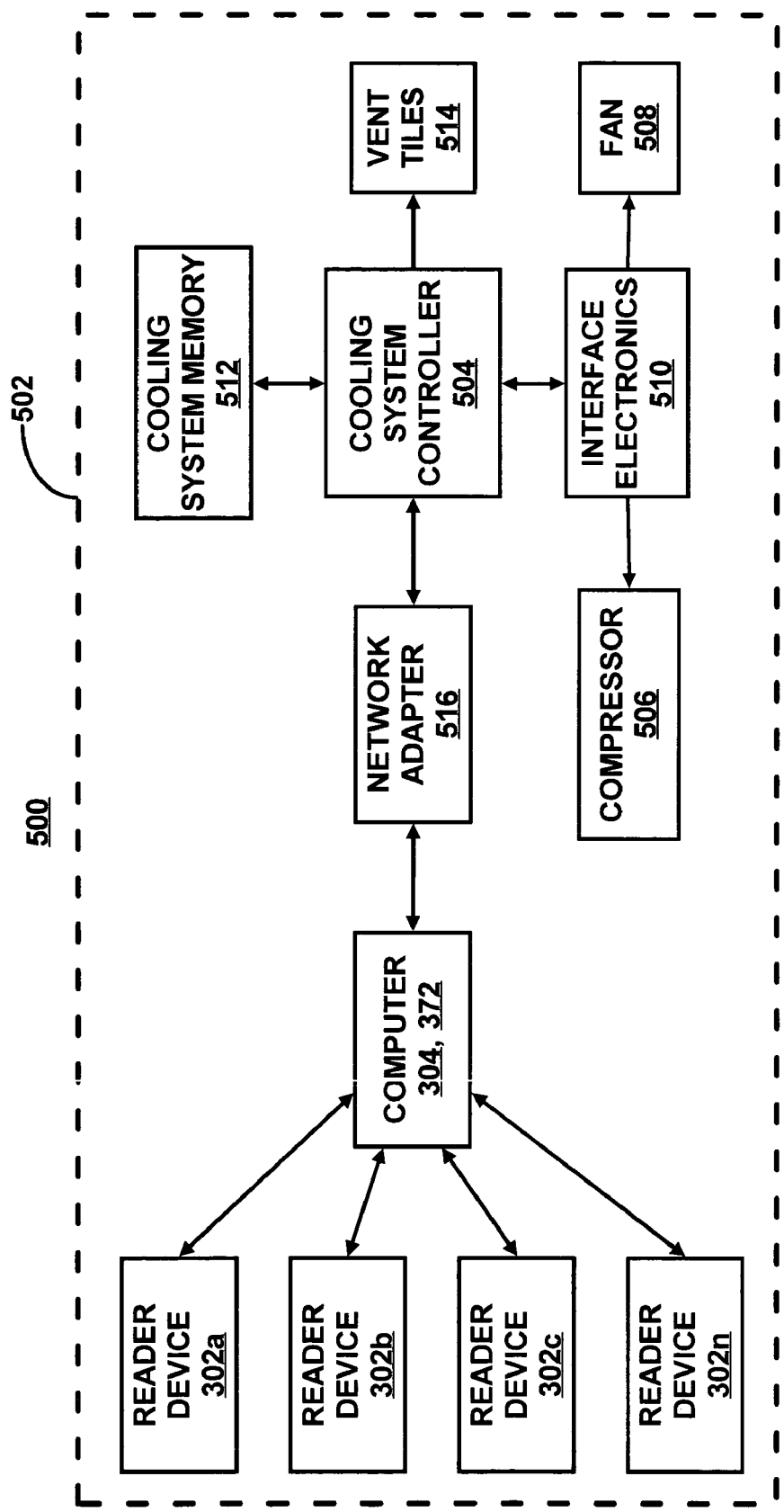
FIG. 5 is an exemplary block diagram for a cooling system according to an embodiment of the invention.

FIG. 5 is an exemplary block diagram 500 for a cooling system 502 according to an embodiment of the invention. It should be understood that the following description of the block diagram 500 is but one manner of a variety of different manners in which the cooling system 502 may be operated. In addition, it should be understood that the cooling system 502 may include additional components and that some of the components described may be removed and/or modified without departing from the scope of the invention.

As illustrated in FIG. 5, the reader devices 302a-302n, e.g., reader devices 142a-142c, 302, 354, and the computer 304 and/or 372 may form part of the cooling system 502. More particularly, the environmental condition information gathered by the reader devices 302a-302n may be implemented by a cooling system controller 504 to vary the cooling fluid delivery to various sections of the data center and/or its temperature. Thus, for instance, cooling fluid delivery may be either increased or decreased for those sections of the data center where it is determined that their environmental condition(s) are outside the predetermined ranges.

The cooling system controller 504 may comprise a microprocessor, a micro-controller, an application specific integrated circuit (ASIC), and the like. The cooling system controller 504 is generally configured to operate at least one of a compressor 506 and a fan 508. In this regard, the compressor 506 may comprise a constant speed compressor, a variable speed compressor, a heat exchanger, a chilled water heat exchanger, a centrifugal chiller, and the like. More particularly, the cooling system controller 504 may be configured to vary the operation of one or more of the above-recited components to vary the amount of heat transfer from the cooling fluid to thereby vary the cooling fluid temperature.

Interface electronics 510 may be provided to act as an interface between the cooling system controller 504 and the components for operating the cooling system, e.g., the supply of voltage to vary the speed of the compressor, control of the heat exchanger (centrifugal chiller) capacity, fan speed, etc.

The cooling system controller 504 may also be interfaced with a cooling system memory 512 configured to provide storage of a computer software that provides the functionality of the cooling system, e.g., compressor, heat exchanger, fan, and the like, and may be executed by the cooling system controller 504. The cooling system memory 512 may be implemented as a combination of volatile and non-volatile memory, such as DRAM, EEPROM, flash memory, and the like. The cooling system memory 512 may also be configured to provide a storage for containing data/information pertaining to the manner in which the compressor (heat exchanger, chiller) and/or fan, may be manipulated in response to, for example, variations in the temperature of the cooling fluid and/or air flow characteristics in the data center.

In one respect, the capacity (e.g., the amount of work exerted on the refrigerant, for example) of the compressor 506 (heat exchanger, chiller, etc.) may be modified to thereby control the temperature of the cooling fluid. The compressor 506 (heat exchanger, chiller, etc.) may thus be controlled to either increase or decrease the mass flow rate of the refrigerant flowing therethrough depending upon changing cooling requirements. Consequently, for example, when the temperature in the data center is below a predetermined range, the capacity of the compressor 506 (heat exchanger, chiller, etc.) may be reduced to substantially reduce the amount of work, and thus the amount of energy exerted on the refrigerant.

Because the specific type of compressor 506 (heat exchanger, chiller, etc.) to be employed with embodiments of the invention may vary according to individual needs, the invention is not limited to any specific type of compressor (heat exchanger, chiller, etc.). Instead, any reasonably suitable type of compressor (heat exchanger, chiller, etc.) capable of accomplishing certain embodiments of the invention may be employed with the embodiments of the invention. The choice of compressor (heat exchanger, chiller, etc.) may therefore depend upon a plurality of factors, e.g., cooling requirements, costs, operating expenses, etc.

In addition, or in the alternative, the speed of the fan 508 may be modified according to changes in cooling needs. Thus, for example, if the components of the data center generate a larger amount of heat, the fan 508 speed may be increased to increase the cooling fluid delivery to those components. In addition, the invention is not limited to any specific type of fan. Instead, any reasonably suitable type of fan capable of accomplishing certain aspects of the invention may be employed with embodiments of the invention. The choice of fan may therefore be dependent upon a plurality of factors, e.g., cooling requirements, costs, operating expenses, etc.

The cooling system controller 504 may operate the compressor 506 (heat exchanger, chiller, etc.) and the fan 508 in a manner to vary the cooling fluid temperature and volume in response to various degrees of detected increases/decreases in environmental conditions within the data center. More particularly, a look up table (not shown) may be stored in the cooling system memory 512. By way of example, the look up table may include information pertaining to the level of compressor 506 speed (heat exchanger capacity, etc.) increase necessary for a detected increase in the temperature around the racks 102-108. In this respect, the compressor speed (heat exchanger capacity, etc.) may be varied substantially incrementally in response to detected changes in the environmental conditions within the data center.

The cooling system controller 504 may also control or direct the control of vent tiles 514, e.g., vents 116, to vary the flow of cooling fluid delivery to various sections of the data center.

A network adapter 516 may be provided as an interface between the computer 304, 372 and the cooling system controller 504 to enable data transmission therebetween. In this regard, the network adapter 516 may enable communication via a wired protocol, such as IEEE 802.3, etc., wireless protocols, such as IEEE 801.11b, wireless serial connection, Bluetooth, etc., or combinations thereof.

Although FIG. 5 illustrates both the computer 304, 372 and the cooling system controller 504, it is within the purview of the present invention that the cooling system controller 504 may receive information directly from the reader devices 302a-302n without departing from the scope of the invention. In this instance, the cooling system controller 504 may be configured to perform those steps that the computer 304, 372 is designed to perform in the operational mode 450.

According to embodiments of the invention, the cooling system components may be manipulated in manners similar to those manners described in co-pending U.S. patent application Ser. No. 09/970,707. For example, as described with respect to FIGS. 3A and 3B of that document, components of the cooling system may be manipulated to afford zonal and global temperature control within the data center. In addition, cooling system operations may be based upon detected temperatures and/or pressures at various locations within the data center. In like manners, the components of the cooling system of the present invention may be manipulated to provide local and zonal temperature variations according to the principles set forth in U.S. patent application Ser. No. 09/970,707.

According to additional embodiments of the invention, the cooling system components may be manipulated in manners similar to those manners described in co-pending U.S. patent application Ser. No. 10/210,040. As described in that application, HEU's may be provided to enable generally localized receipt of air and delivery of cooling fluid to the racks of a data center. The control of the cooling fluid delivery and intake of air may be based according to detected temperatures in the vicinities of the racks. The components of the cooling system (e.g., HEU's 172, 174 (FIG. 1D)) of the present invention may be operated in likewise manners.

According to a further embodiment of the invention, the cooling system components may be manipulated in manners similar to those manners described in co-pending U.S. patent application Ser. No. 10/262,879. As described in that application with respect to FIGS. 3A and 3B, components of a cooling system may be manipulated to vary cooling fluid characteristics, e.g., temperature, pressure, volume, etc., in a data center. In addition, a return configured to vary the flow and direction of air intake from the data center may be used to control air removal from the data center. The components of the cooling system (e.g., returns 164, 166 (FIG. 1C)) of the present invention may be operated in likewise manners.

According to yet further embodiments of the invention, the cooling system components may be manipulated in manners similar to those manners described in co-pending U.S. patent application Ser. No. 10/303,761. As set forth in that application, the plenum of a data center may be divided into various zones by controllable partitions. The pressure within the zones may be varied by operation of the controllable partitions and the controllable partitions may be manipulated in response to detected changes in temperature and/or pressure either in the data center or in the zones of the plenum. The data center, e.g., data center 100 (FIGS. 1A and 1B), of the present invention may be provided with the partitions described in U.S. patent application Ser. No. 10/303,761 and may operate in similar manners to those set forth in that application. In this regard, the cooling system components of the present invention may be operated in manners similar to those set forth in U.S. patent application Ser. No. 10/303,761.

According to yet further embodiments of the invention, the cooling system components may be manipulated in manners similar to those manners described in co-pending U.S. patent application Ser. No. 10/351,427. As described in that application, air flow through vents of a cooling system may be varied according to detected pressures in the plenum of a data center. The data center, e.g., data center 500 (FIG. 5), of the present invention may include similarly configured vents and pressure sensors. In this regard, the cooling system components of the present invention may be manipulated in manners similar to those described in U.S. patent application Ser. No. 10/351,427.

As described in greater detail in the co-pending applications listed hereinabove, a computational fluid dynamics (CFD) tool may be implemented substantially simultaneously with the cooling system 502. More specifically, the CFD tool may be utilized to substantially continuously vary the operation of the cooling system to operate according to the heat loads generated in the racks. In this regard, the anticipated (e.g., based upon the power draw of the components) or actual heat loads on the racks may be inputted into the CFD tool, along with one or more of the following properties: velocity of the cooling fluid flowing through various sections of the room and the distribution of temperature and pressure of the cooling fluid in the data center. These environmental conditions may be detected by the detecting devices, imaged by the reader devices, and transmitted to the cooling system controller.

In this regard, the CFD tool may be implemented to produce a numerical model of the room to thus determine an optimized cooling distribution within the room. A correlation of one or more of the following properties: velocity of the cooling fluid flowing through various sections of the room, distribution of temperature and pressure of the cooling fluid in the room, and the power draw into the racks, may be created based on the numerical modeling. The correlation may be used to infer thermal conditions throughout the room when only a minimum number of sensors are available during operation of the cooling system. In addition, the correlation may substantially reduce the amount of time required for the CFD tool to perform the computing operations. Moreover, the cooling system controller may use the numerical model of the cooling distribution in the data center to manipulate operations of the cooling system components. In this respect, environmental conditions within the data center may be substantially maintained within predetermined operating ranges.

The operations set forth in the operational mode 450 of FIG. 4B may be contained as a utility, program, or a subprogram, in any desired computer accessible medium. In addition, the operational mode 450 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 6:
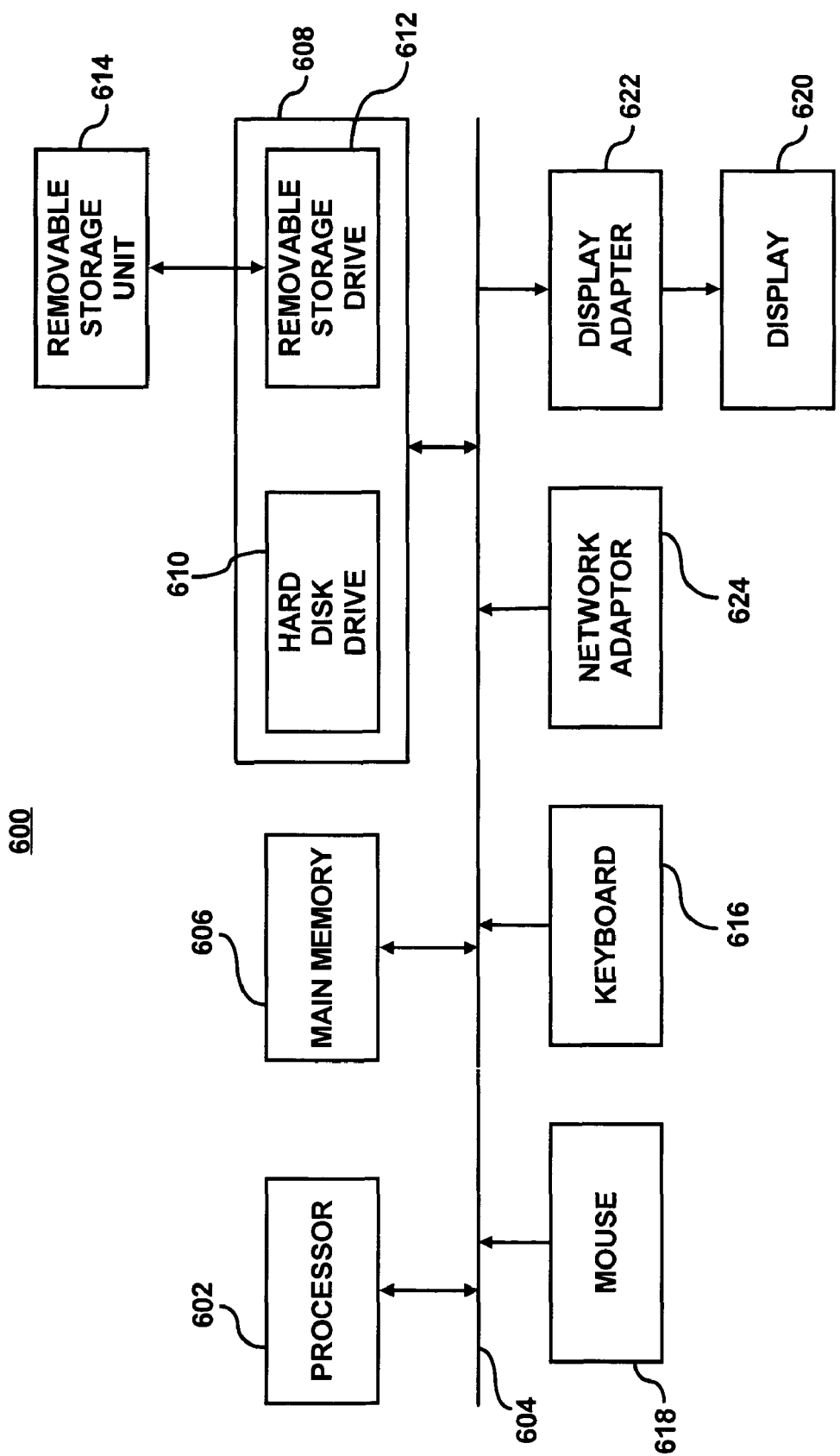
FIG. 6 illustrates an exemplary computer system according to an embodiment of the invention.

FIG. 6 illustrates an exemplary computer system 600, according to an embodiment of the invention. The computer system 600 may include the computer 304, the device controller 356, and/or the computer 372. In this respect, the computer system 600 may be used as a platform for executing one or more of the functions described hereinabove with respect to the computer 304, device controller 356, and/or the computer 372.

The computer system 600 includes one or more controllers, such as a processor 602. The processor 602 may be used to execute some or all of the steps described in the operational mode 450. Commands and data from the processor 602 are communicated over a communication bus 604. The computer system 600 also includes a main memory 606, e.g., memory 314 and/or 368, such as a random access memory (RAM), where the program code for the reader device 302, 354 may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the provisioning system may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, e.g., the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (e.g., user input devices, secondary memory, etc.).

By virtue of certain embodiments of the present invention, the costs associated with detecting environmental conditions in a room may be substantially reduced compared with known detecting techniques. In one respect, the costs may be reduced through use of relatively simple and inexpensive temperature sensors, e.g., temperature sensitive liquid crystals. In addition, the amount of energy required to detect the environmental conditions may also be reduced because these temperature sensors do not require energy to operate. Moreover, through use of the reader devices, the amount of work required by data center personnel in determining environmental conditions in the data center may also be substantially reduced.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A system for detecting at least one environmental condition in a room, said system comprising:
   one or more detecting devices having a sensor configured to detect the at least one environmental condition and to display the detected at least one environmental condition, at least one of said one or more detecting devices comprising identifying indicia, said identifying indicia being configured to distinguish the at least one detecting device from the other one or more detecting devices;
   one or more reader devices configured to image the one or more detecting devices;
   a controller configured to communicate with the one or more reader devices, wherein said controller is operable to control said one or more reader devices and to receive the images from the one or more reader devices, and wherein said controller is configured to determine the at least one environmental condition based upon the images of the one or more detecting devices; and
   a memory accessible by said controller, wherein said controller is configured to store the at least one environmental condition in the memory.

2. The system according to claim 1, wherein the at least one environmental condition comprises at least one of temperature, pressure and humidity.

3. The system according to claim 1, wherein the sensors of the one or more detecting devices comprise at least one liquid crystal configured to change color depending upon the temperature of the liquid crystal, and wherein the controller is configured to determine the at least one environmental condition based upon the color of the at least one liquid crystal.

4. The system according to claim 3, wherein the at least one liquid crystal comprises a plurality of liquid crystals, each said liquid crystal being configured to change color when its temperature reaches a predetermined range.

5. The system according to claim 1, wherein the one or more detecting devices comprise metallic foils and the sensors comprise liquid crystal coatings on said metallic foils.

6. The system according to claim 1, wherein the one or more detecting devices comprises at least one of a mercury thermometer and a bi-metallic spiral spring thermometer.

7. The system according to claim 1, wherein the identifying indicia comprises at least one of text, barcode, color identity markers, or a display on a screen.

8. The system according to claim 1, further comprising:
   means for determining the locations of the one or more detecting devices; and
   wherein the controller is operable to store the locations of the one or more detecting devices along with the identification information of the one or more detecting devices in the memory.

9. The system according to claim 1, wherein the one or more detecting devices comprises a color calibration patch.

10. The system according to claim 1, wherein the one or more detecting devices are attached to a substrate in the room via an insulating member.

11. The system according to claim 1, wherein the one or more reader devices comprise at least one of an imaging device and an infrared reader.

12. The system according to claim 1, wherein the one or more reader devices arc located on at least one of a wall, ceiling, or floor or the room, or an object in the room.

13. The system according to claim 12, wherein the one or more reader devices comprises at least one actuator configured to articulate the one or more reader devices.

14. The system according to claim 1, wherein at least one of the one or more reader devices is attached to a robotic device configured to travel through the room.

15. A method for measuring at least one environmental condition in a room, said method comprising:
   preparing one or more detecting devices having a sensor configured to detect the at least one environmental condition and to display the detected at least one environmental condition, wherein the step of preparing one or more detecting devices further comprises placing identifying indicia on at least one of said one or more detecting devices, said identifying indicia being configured to distinguish the at least one detecting device from the other one or more detecting devices;
   positioning the one or more detecting devices in the room;
   imaging the one or more detecting devices with one or more reader devices; and
   determining the at least one environmental condition detected by the one or more detecting devices based upon the images of the one or more detecting devices.

16. The method according to claim 15, further comprising:
   associating the one or more detecting devices with their locutions in the room; and
   storing the locations of the one or more detecting devices in a memory.

17. The method according to claim 16, wherein the step of preparing one or more detecting devices further comprises:
   determining the identities of the one or more detecting devices bused upon the images of the one or more detecting devices; and
   wherein the step of storing the locations of the one or more detecting devices comprises storing the identification information of the one or more detecting devices in the memory.

18. The method according to claim 16, further comprising:
   correlating the at least one detected environmental condition with the locations of the one or more detecting devices; and
   determining a distribution of the at least one detected environmental condition based upon the correlation of the at least one detected environmental condition and the locations of the one or more detecting devices.

19. The method according to claim 15, further comprising:
   associating additional one or more detecting devices with their locations in response to a detection of the additional one or more detecting devices;
   imaging the additional one or more detecting devices; and
   determining at least one environmental condition detected by the additional one or more detecting devices based upon the images of the additional one or more detecting devices.

20. The method according to claim 15, wherein the sensors of the one or more detecting devices comprise liquid crystals and wherein the step of determining the at least one environmental condition detected by the one or more detecting devices comprises determining the color of the sensors of the one or more detecting devices.

21. The method according to claim 15, further comprising:
  positioning the one or more reader devices on a robotic device; and
  maneuvering the robotic device to various positions in the room to image the one or more detecting devices.

22. The method according to claim 15, further comprising:
  positioning the one or more reader devices on at least one of a wall, floor and ceiling of the room or an object in the room; and
  articulating the one or more reader devices to image the one or more detecting devices positioned at various locations of the room.

23. A method for controlling at least one environmental condition in a room, said method comprising:
  preparing one or more detecting devices having a sensor configured to detect the at least one environmental condition and to display the detected at least one environmental condition, wherein the step of preparing one or more detecting devices further comprises placing identifying indicia on at least one of said one or more detecting devices, said identifying indicia being configured to distinguish the at least one detecting device from the other one or more detecting devices;
  positioning the one or more detecting devices in the room;
  imaging the one or more detecting devices with one or more reader devices;
  determining the at least one environmental condition detected by the one or more detecting devices based upon the images of the one or more detecting devices; and
  manipulating one or more cooling system components in response to the at least one environmental condition falling outside of predetermined ranges.

24. The method according to claim 23, wherein the step of manipulating one or more cooling system components comprises varying one or more of airflow through a vent and operation of an air conditioning unit.

25. The method according to claim 23, further comprising:
  associating the one or more detecting devices with one or more vent tiles and air conditioning units affecting the at least one environmental condition of the one or more detecting devices; and
  wherein the step of manipulating one or more cooling system components comprises manipulating the one or more vent tiles and air conditioning units that affect the at least one environmental condition of the one or more detecting devices having the at least one environmental condition falling outside the predetermined range.

26. A system for detecting at least one environmental condition in a room, said system comprising:
  a plurality of means for detecting the at least one environmental condition;
  means for distinguishing the plurality of means for detecting from each other, said means for distinguishing comprising identification information;
  means for imaging the means for detecting the at least one environmental condition and the means for identifying;
  means for determining the at least one environmental condition from the means for imaging the means for detecting.

27. The system according to claim 26, further comprising:
  means for identifying locations of the plurality means for detecting;
  means for correlating the identification information and the locations of the plurality of means for detecting; and
  means for storing the identification information, location information and the detected at least one environmental condition.

28. The system according to claim 26, further comprising:
  means for determining a distribution of the at least one environmental condition in to room; and
  means for varying one or more cooling system components based upon the distribution of the at least one environmental condition in the room.

29. The system according to claim 26, further comprising:
  means for maneuvering the means for imaging around the room to obtain images of the means for detecting located at various positions in to room.

30. A computer readable storage medium on which is embedded one or more computer programs, said one or more computer programs implementing a method for measuring at least one environmental condition in a room, said one or more computer programs comprising a set of instructions for:
  implementing one or more reader devices to image one or more detecting devices having a sensor configured to detect the at least one environmental condition and to display the detected at least one environmental condition, wherein at least one of the one or more detecting devices comprise identifying indicia, said identifying indicia being configured to distinguish the at least one detecting device from the other one or more detecting devices; and
  determining the at least one environmental condition detected by the one or more detecting devices based upon the images of the one or more detecting devices.

31. The computer readable storage medium according to claim 30, said one or more computer programs further comprising a set of instructions for:
  associating the one or more detecting devices with their locations in the room; and
  storing the locations of the one or more detecting devices in a memory.

32. The computer readable storage medium according to claim 31, said one or more computer programs further comprising a set of instructions for:
  determining the identities of the one or more detecting devices based upon the images of the one or more detecting devices; and
  storing the identification information of the one or more detecting devices in the memory.

33. The computer readable storage medium according to claim 30, said one or more computer programs further comprising a set of instructions for:
  correlating the at least one detected environmental condition with the locations of the one or more detecting devices; and
  determining a distribution of the at least one detected environmental condition based upon the correlation of the at least one detected environmental condition and the locations of the one or more detecting devices.

34. The computer readable storage medium according to claim 30, said one or more computer programs further comprising a set of instructions for:

determining the color of the sensors of the one or more detecting devices to determine the detected at least one environmental condition.

35. The computer readable storage medium according to claim 30, said one or more computer programs Thither comprising a sot of instructions for:
    implementing a robotic device having the one or more reader devices; and
    maneuvering the robotic device to various positions in the room to image the one or more detecting devices.

36. The computer readable storage medium according to claim 30, said one or more computer programs further comprising a set of instructions for:
    implementing one or more reader devices attached on at least one of a wall, floor and ceiling of the room or on an object in the room; and
    articulating the one or more reader devices to image the one or more detecting devices positioned at various locations of the room.

* * * * *

UNITED STATES PATENT AND TRADEMARK OFFICE
CERTIFICATE OF CORRECTION

PATENT NO. : 7,272,945 B2
APPLICATION NO. : 10/628369
DATED : September 25, 2007
INVENTOR(S) : Cullen Edwin Bash et al.

It is certified that error appears in the above-identified patent and that said Letters Patent is hereby corrected as shown below:

In column 6, line 53, after "components," delete "18" and insert -- 118 --, therefor.

In column 29, line 66, in Claim 12, after "devices" delete "arc" and insert -- are --, therefor.

In column 29, line 67, in Claim 12, after "or floor" delete "or" and insert -- of --, therefor.

In column 30, line 28, in Claim 16, delete "locutions" and insert -- locations --, therefor.

In column 30, line 36, in Claim 17, after "devices" delete "bused" and insert -- based --, therefor.

In column 32, line 10, in Claim 28, after "condition in" delete "to" and insert -- the --, therefor.

In column 32, line 18, in Claim 29, after "positions in" delete "to" and insert -- the --, therefor.

In column 33, line 5, in Claim 35, delete "Thither" and insert -- further --, therefor.

In column 33, line 5, in Claim 35, after "comprising a" delete "sot" and insert -- set --, therefor.

Signed and Sealed this

Twenty-third Day of June, 2009

JOHN DOLL
*Acting Director of the United States Patent and Trademark Office*